(12) United States Patent
Zheng et al.

(10) Patent No.: US 8,580,384 B2
(45) Date of Patent: Nov. 12, 2013

(54) DIELECTRIC MATERIALS AND METHODS OF PREPARATION AND USE THEREOF

(75) Inventors: Yan Zheng, Skokie, IL (US); Jordan Quinn, Skokie, IL (US); He Yan, Skokie, IL (US); Yan Hu, Skokie, IL (US); Shaofeng Lu, Skokie, IL (US); Antonio Facchetti, Chicago, IL (US)

(73) Assignee: Polyera Corporation, Skokie, IL (US)

( * ) Notice: Subject to any disclaimer, the term of this patent is extended or adjusted under 35 U.S.C. 154(b) by 385 days.

(21) Appl. No.: 13/007,148

(22) Filed: Jan. 14, 2011

(65) Prior Publication Data

US 2011/0175089 A1     Jul. 21, 2011

Related U.S. Application Data

(60) Provisional application No. 61/295,725, filed on Jan. 17, 2010.

(51) Int. Cl.
    *B32B 15/08*    (2006.01)
    *B32B 27/00*    (2006.01)
    *B32B 27/36*    (2006.01)

(52) U.S. Cl.
    USPC .................. 428/411.1; 428/457; 428/480

(58) Field of Classification Search
    None
    See application file for complete search history.

(56) References Cited

U.S. PATENT DOCUMENTS

| | | | |
|---|---|---|---|
| 2006/0247383 A1 | 11/2006 | Hedrick et al. | |
| 2007/0073024 A1 | 3/2007 | Wariishi | |
| 2007/0262421 A1* | 11/2007 | Lehman et al. | 257/642 |
| 2009/0306310 A1 | 12/2009 | Wu et al. | |
| 2010/0051922 A1 | 3/2010 | Hotta et al. | |

* cited by examiner

*Primary Examiner* — Ramsey Zacharia
(74) *Attorney, Agent, or Firm* — Karen K. Chan

(57) ABSTRACT

Disclosed are dendritic macromolecule-based dielectric compositions (e.g., formulations) and materials (e.g. films) and associated devices. The dendritic macromolecules have branched ends that are functionalized with an organic group that includes at least one 3-40 membered cyclic group.

18 Claims, 11 Drawing Sheets

DIELECTRIC MATERIALS AND METHODS OF PREPARATION AND USE THEREOF

CROSS REFERENCE TO RELATED APPLICATIONS

This application claims priority to and the benefit of U.S. Provisional Patent Application Ser. No. 61/295,725, filed on Jan. 17, 2010, the disclosure of which is incorporated by reference herein in its entirety.

INTRODUCTION

The next generation of electronic devices will be based on solution-processed thin-film transistors (TFTs) enabled by organic or hybrid semiconductor and dielectric materials, printable conductors, flexible substrates, and low-cost (e.g., large-area and low-temperature) manufacturing processes. TFTs are key building blocks of any electronic circuit. A critical component in most solution-processed TFTs is the dielectric layer, which serves as the gate electrical insulator material. The dielectric layer can be formed on either the gate contact (in bottom-gate transistor structures) or on the semiconductor layer (in top-gate transistor structures) by depositing an electrically insulating (i.e., dielectric) compound using, for example, a solution-phase process such as spin-coating or printing. To create a uniform interface between the semiconductor and the dielectric layers, it is necessary that the solvent mobilizing the dielectric compound does not dissolve the semiconductor material and vice versa. Because semiconductor materials are usually soluble in organic chlorinated polar solvents, it is important that the dielectric material affording the dielectric layer is processable in other types of organic solvents. Furthermore, to reduce leakage current density, maximize gate capacitance, and enable large-quantity charge carrier accumulation in the semiconductor layer upon application of an electrical potential on the gate electrode, it is desirable that the dielectric constant (k, a property also known as relative permittivity) of the gate dielectric is sufficiently large. In the organic electronic field, and specifically for organic thin-film transistor applications, an example of a low-k polymeric material that can be used as the gate dielectric is CYTOP®, a fluorinated polymer (k~2), whereas poly(methyl methacrylate) (k~3.6) and poly(vinyl phenol) (k~4.5-5.5) are examples of high-k polymeric materials. Achieving relatively large k, low-leakage, and desired processability properties simultaneously in a class of compounds has proven to be challenging.

Accordingly, there is a desire in the art to design and synthesize dielectric materials which have a high dielectric constant, good solubility in solvents in which common organic semiconductor materials are not substantially soluble, and which are compatible with diverse gate and/or semiconductor materials.

SUMMARY

In light of the foregoing, the present teachings provide electrically insulating (i.e., dielectric) dendritic macromolecules, dendritic macromolecule-based dielectric compositions (e.g., formulations) and materials (e.g., films), and associated devices that can address various deficiencies and shortcomings of the prior art, including those outlined above.

While dendritic macromolecules have been used as porogens with other polymers to prepare low-k nanoporous dielectric materials, the dendritic macromolecules typically are incorporated into a precursor form of the material as fugitives only, and are subsequently decomposed (usually via thermal treatment) to create empty (air-filled), low-k voids (k of air is about 1). Therefore, the dendritic macromolecules are not present in the final dielectric material. To the inventors' knowledge, dendritic macromolecules that can enable high-k dielectric materials and at the same time withstand relatively high-temperature processing and have good solubility in organic solvents orthogonal to common solvents used to process organic semiconductors are unknown.

In one aspect, the present teachings provide various dendritic macromolecules that can be used to prepare dielectric materials. The dendritic macromolecules of the present teachings are end-functionalized with organic groups that include at least one cyclic groups. In addition, the present dendritic macromolecules can include a dendritic or hyperbranched core (which includes the initiator core and generations of branches) that is characterized by a high dielectric constant (e.g., k>3). In various embodiments, the dendritic or hyperbranched core can be a polymer other than a polysiloxane. In various embodiments, the dendritic or hyperbranched core can include at least one non-aromatic repeating units; that is, at least one of the repeating units from which the branches are derived does not include any aromatic groups. In certain embodiments, the dendritic or hyperbranched core can consist of non-aromatic branches; that is, the various generations of branches are derived from non-aromatic repeating units only, although as described hereinbelow, the end groups of the branches (i.e., the periphery of the dendritic macromolecules) can include one or more aromatic groups.

In various embodiments, the present dendritic macromolecules can include branched ends that are functionalized with an organic group that includes one, two, three, or four optionally substituted 3-40 membered cyclic groups. In various embodiments, each of the optionally substituted 3-40 membered cyclic groups independently can be selected from an optionally substituted $C_{3-40}$ cycloalkyl group, an optionally substituted $C_{6-40}$ aryl group, an optionally substituted 3-40 membered cycloheteroalkyl group, and an optionally substituted 5-40 membered heteroaryl group. In certain embodiments, the organic group can include at least one optionally substituted $C_{3-40}$ cycloalkyl group. In certain embodiments, the organic group can include at least one optionally substituted $C_{6-40}$ aryl group. In embodiments where the organic end group includes two or more cyclic groups, the cyclic groups can be covalently bonded to each other (directly or via a linker group). Alternatively, the two or more cyclic groups can be bonded to a common atom. The common atom can be a carbon (C) atom or a heteroatom such as nitrogen (N) or phosphorus (P), where P can be oxidized. In embodiments where the organic end group includes three or four cyclic groups, one of the cyclic groups can serve as a linker group.

In certain embodiments, the organic end group can be crosslinkable, e.g., photocrosslinkable or thermally crosslinkable at temperatures which do not decompose the dendrimer core. In these embodiments, the photo/thermally crosslinkable end group can include a photo/thermally crosslinkable linker, a photo/thermally crosslinkable cyclic group, a cyclic group that is substituted with one or more photo/thermally crosslinkable groups, or combinations thereof. For example, a cyclic group can be photocrosslinkable because of the presence of one or more unsaturated bonds within the ring. In other examples, a cyclic group can be thermally crosslinkable because of the presence of thermally labile groups within the ring. Examples of a photo-crosslinkable organic end group include an organic end group comprising a cinnamoyl group or a coumarinyl group.

The present teachings also provide compositions for forming dielectric materials, where the compositions include one or more dendritic macromolecules dissolved or dispersed in a liquid medium. The compositions can be used to prepare dielectric materials using various solution processes, including various printing techniques.

The present teachings further provide electronic devices that include the dielectric materials described herein. Examples of electronic devices include, but are not limited to, thin-film transistors (TFTs) (e.g., field-effect transistors (FETs)) and thin-film capacitors. In addition to a dielectric component that includes the present dielectric material, these devices also can include at least a semiconductor component and/or one or more electrically conductive components. In some embodiments, the present teachings can provide a thin-film transistor device including a dielectric thin-film layer and a semiconductor thin-film layer, wherein the dielectric thin-film layer is coupled to the semiconductor thin-film layer on one side and an electrically conductive component (i.e., a gate electrode) on the opposite side. Additional electrically conductive components (i.e., a source electrode and a drain electrode) can be present and coupled to the semiconductor thin-film layer on an opposite side to the dielectric thin-film layer.

Methods for preparing the dendritic macromolecules, the dielectric materials, and the electronic devices described above also are provided and are within the scope of the present teachings.

The foregoing as well as other features and advantages of the present teachings will be more fully understood from the following figures, description, and claims.

BRIEF DESCRIPTION OF DRAWINGS

It should be understood that the drawings described below are for illustration purpose only. The drawings are not necessarily to scale, with emphasis generally being placed upon illustrating the principles of the present teachings. The drawings are not intended to limit the scope of the present teachings in any way.

DETAILED DESCRIPTION

Figure 1:
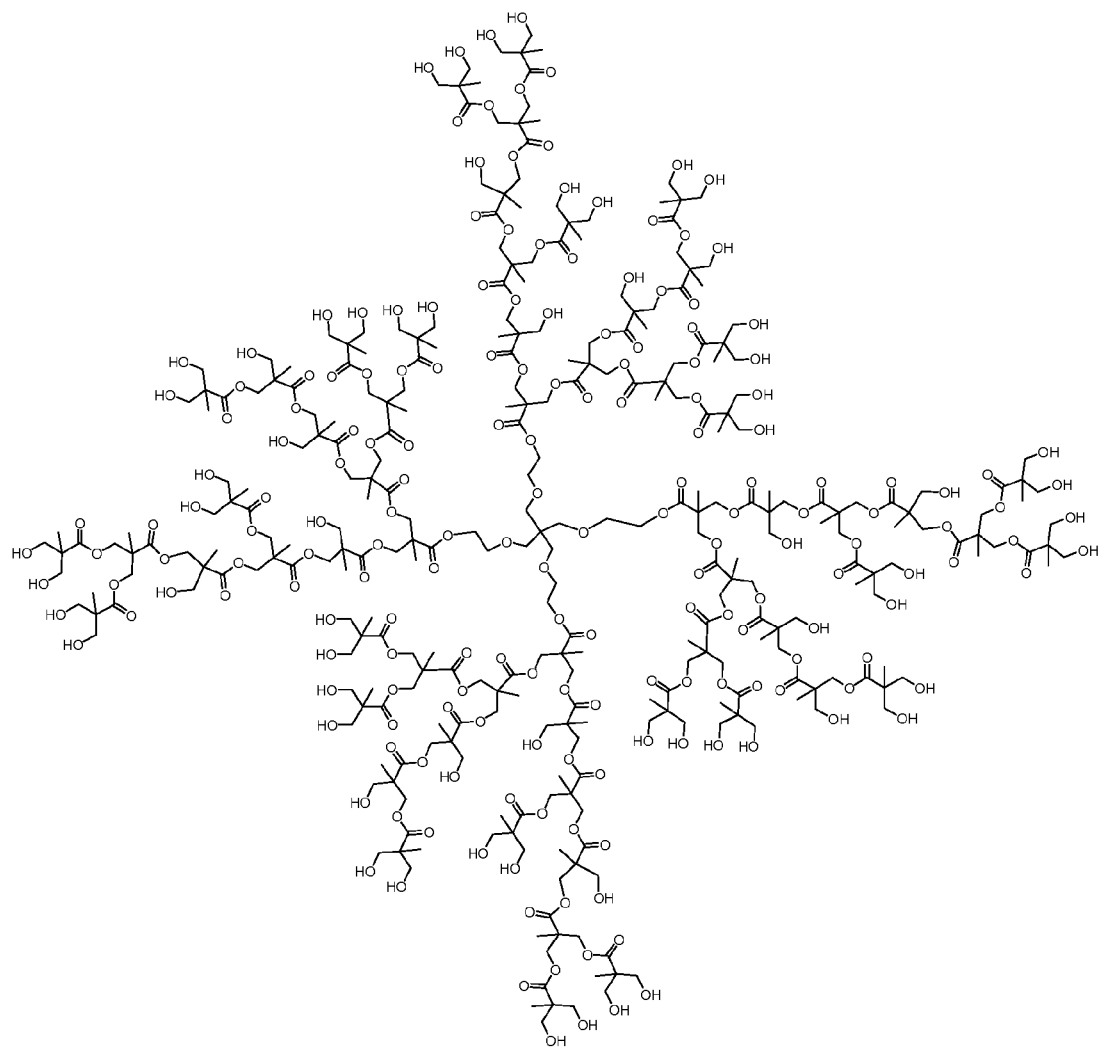
FIG. 1 shows the chemical structure of a fourth-generation hyperbranched polyester based on bis-hydroxymethyl propionic acid (bis-MPA) repeating units having 64 hydroxyl groups (Hyperbranched Bis-MPA Polyester-64-Hydroxyl, Generation 4, available from Sigma-Aldrich Corporation, St. Louis, Mo.).
Figure 2:
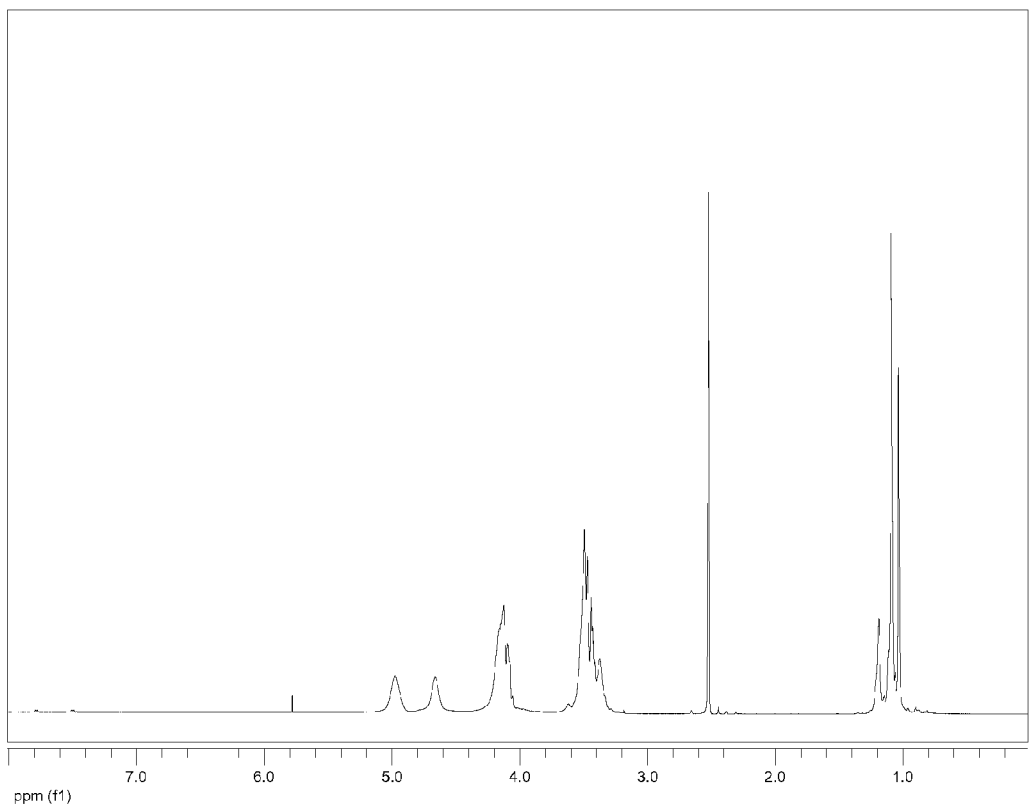
FIG. 2 shows a representative $^1$H NMR spectrum (in DMSO-$d_6$) of Hyperbranched Bis-MPA Polyester-64-Hydroxyl, Generation 4.
Figure 3:
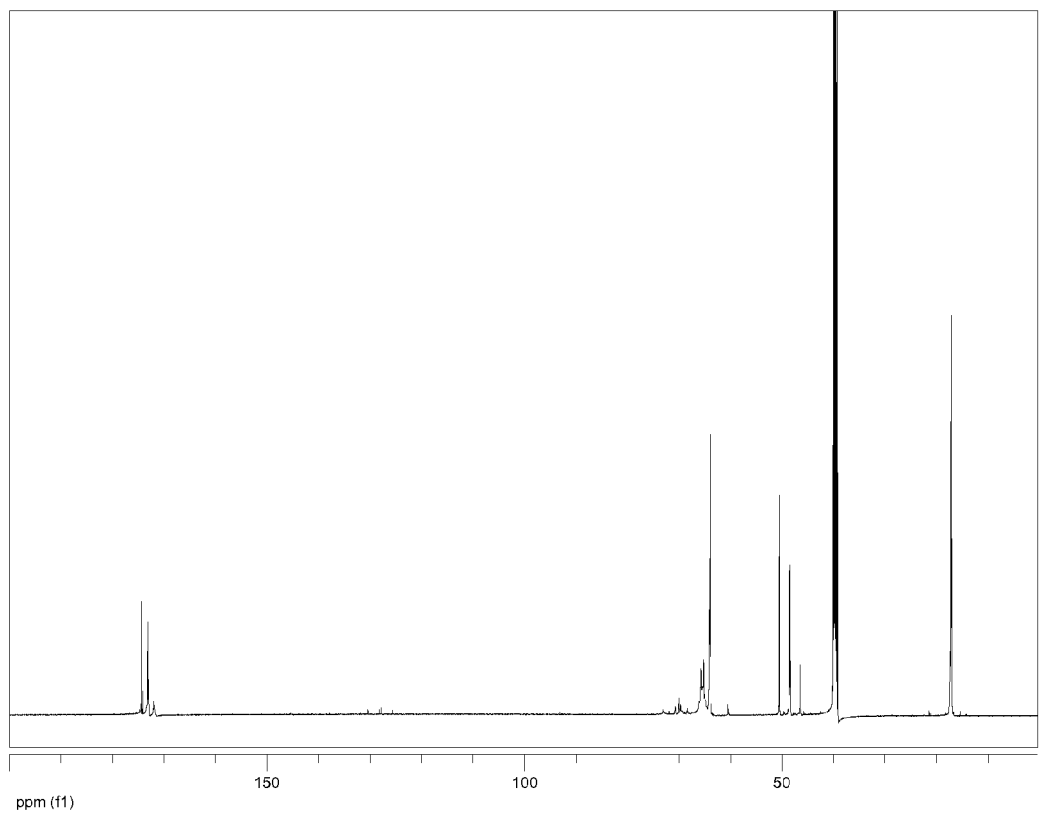
FIG. 3 shows a representative $^{13}$C NMR spectrum (in DMSO-$d_6$) of Hyperbranched Bis-MPA Polyester-64-Hydroxyl, Generation 4.
Figure 4:
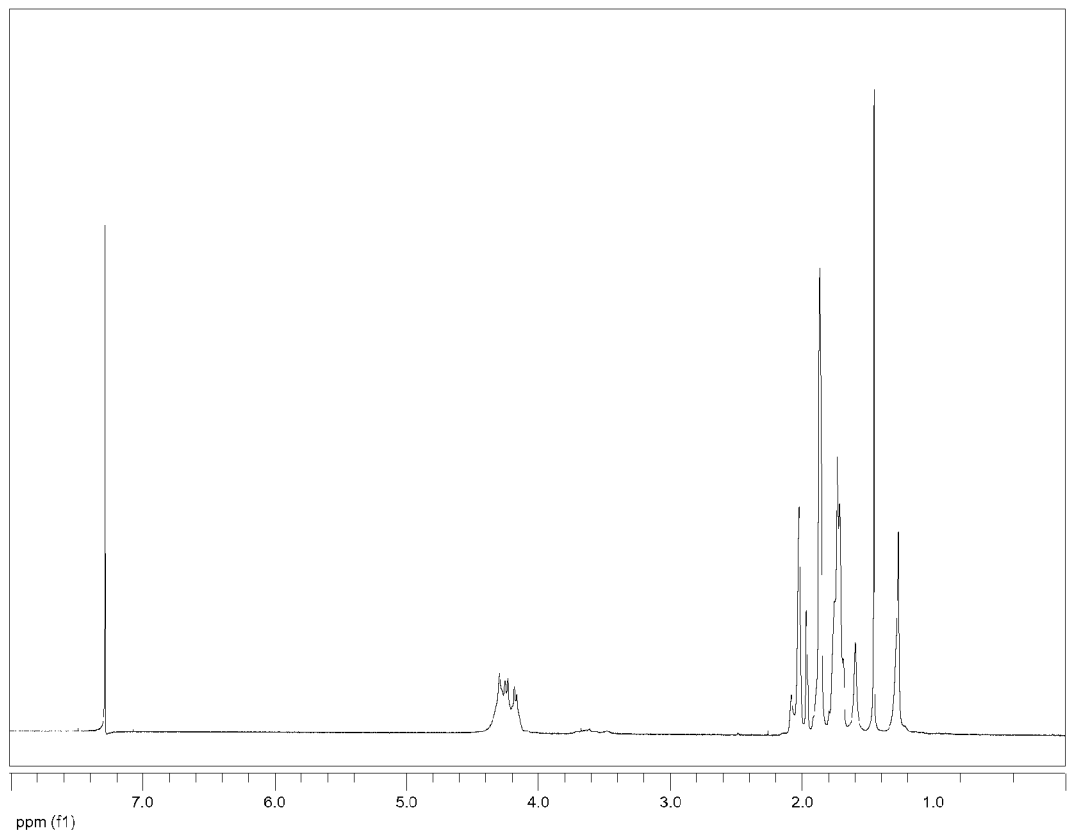
FIG. 4 shows a representative $^1$H NMR spectrum (in CDCl$_3$) of polymer D1.
Figure 5:
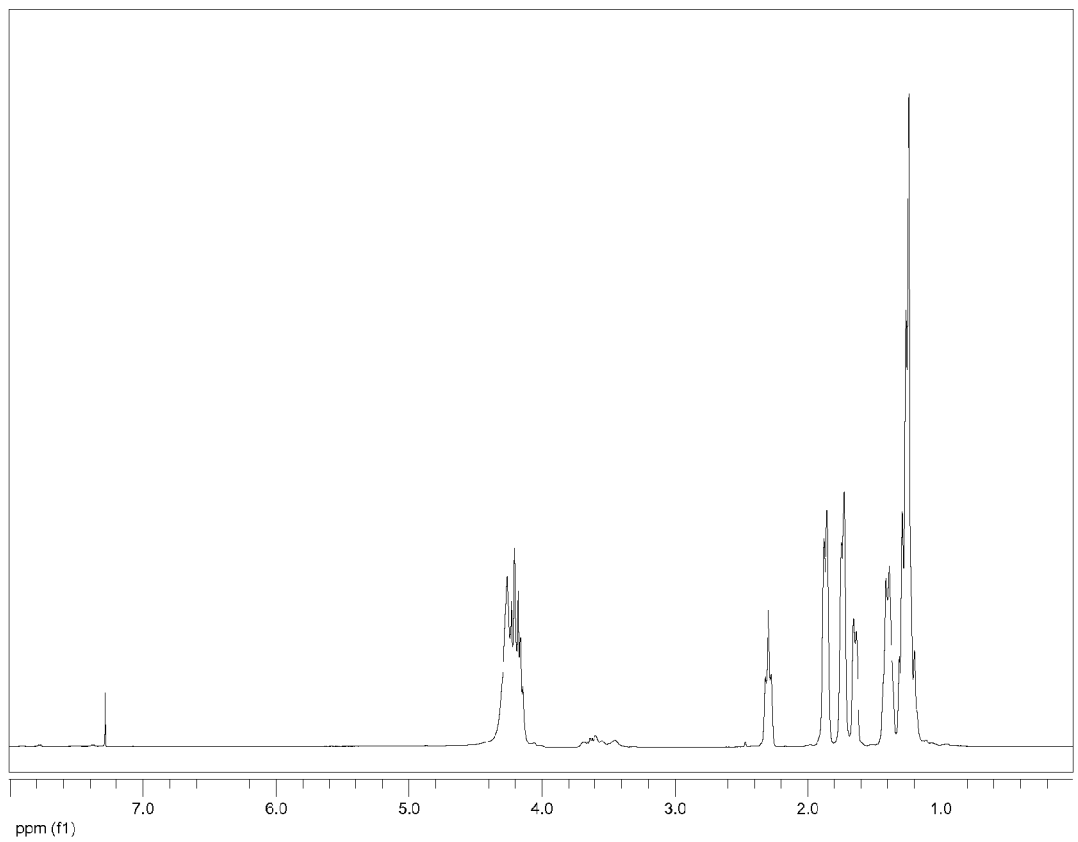
FIG. 5 shows a representative $^1$H NMR spectrum (in CDCl$_3$) of polymer D2.
Figure 6:
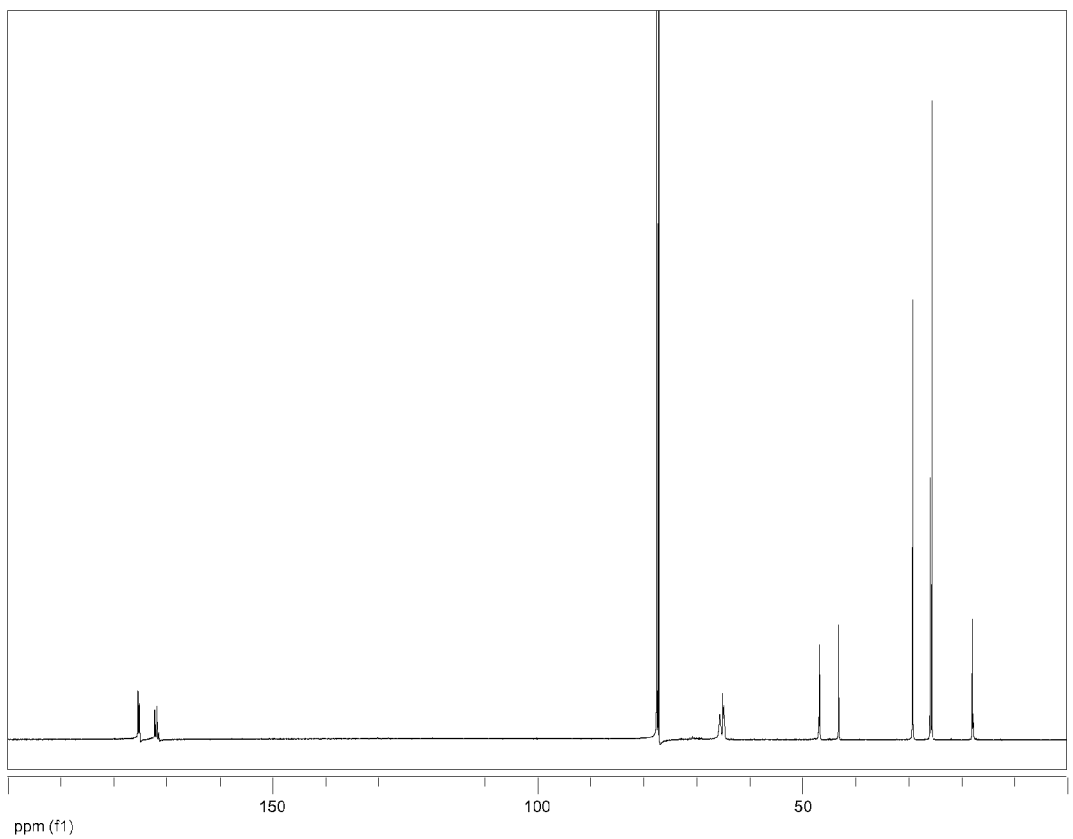
FIG. 6 shows a representative $^{13}$C NMR spectrum (in CDCl$_3$) of polymer D2.
Figure 7:
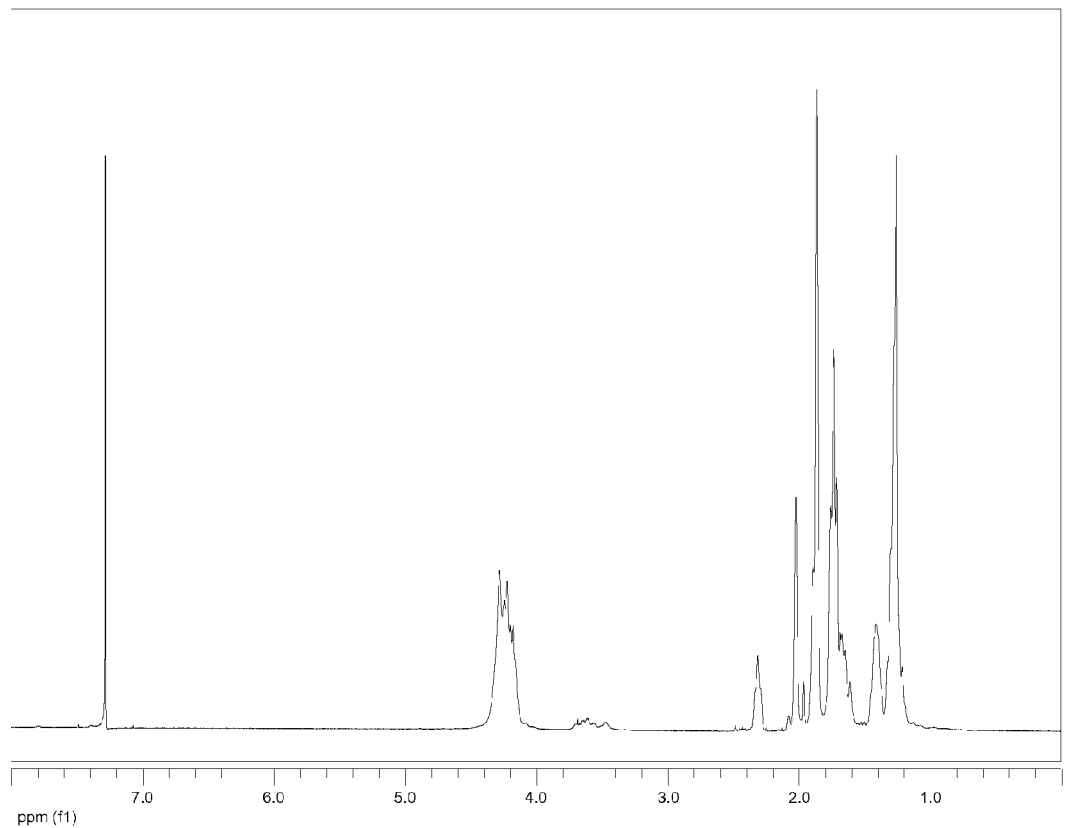
FIG. 7 shows a representative $^1$H NMR spectrum (in CDCl$_3$) of polymer D6.
Figure 8:
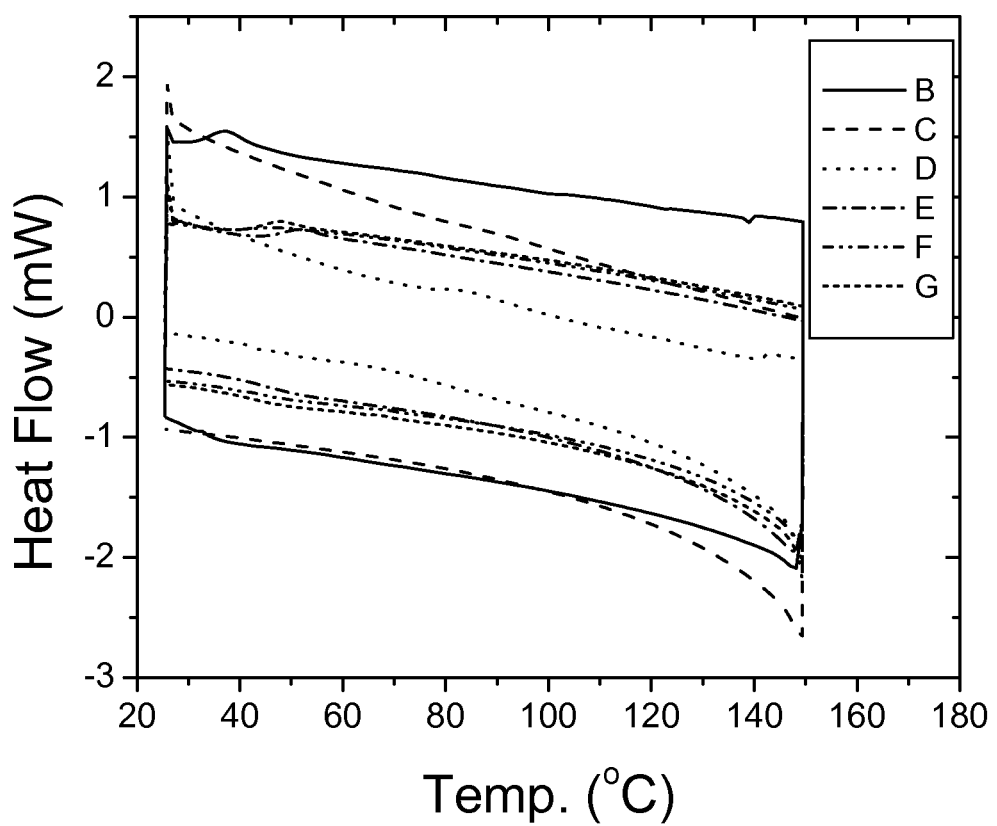
FIG. 8 shows DSC plots of polymers D2 (C), D1 (D), D4 (E), D7 (F), and D8 (G) according to the present teachings as compared to the unfunctionalized hyperbranched bis-MPA polymer (B).

The present teachings relate to organic dielectric materials prepared from end-functionalized dendritic macromolecules, compositions (formulations) for forming these dielectric materials, and composites and devices that include such dielectric materials. In various embodiments, the present teachings provide dendritic macromolecules that can be soluble in organic solvents that are orthogonal to those used to process common organic semiconductor materials, and can exhibit a high dielectric constant (k) and a low leakage current density when used as an electrically insulating (dielectric) material. The dielectric materials also can be air-stable and can have long shelf stability, and can be compatible with a wide range of p-type and n-type organic and inorganic semiconductors, making them attractive materials for fabricating various electronic devices.

Throughout the application, where compositions are described as having, including, or comprising specific components, or where processes are described as having, including, or comprising specific process steps, it is contemplated that compositions of the present teachings also consist essentially of, or consist of, the recited components, and that the processes of the present teachings also consist essentially of, or consist of, the recited process steps.

In the application, where an element or component is said to be included in and/or selected from a list of recited elements or components, it should be understood that the element or component can be any one of the recited elements or components or can be selected from a group consisting of two or more of the recited elements or components. Further, it should be understood that elements and/or features of a composition, an apparatus, or a method described herein can be combined in a variety of ways without departing from the spirit and scope of the present teachings, whether explicit or implicit herein.

The use of the terms "include," "includes", "including," "have," "has," or "having" should be generally understood as open-ended and non-limiting unless specifically stated otherwise.

The use of the singular herein includes the plural (and vice versa) unless specifically stated otherwise. In addition, where the use of the term "about" is before a quantitative value, the present teachings also include the specific quantitative value itself, unless specifically stated otherwise. As used herein, the term "about" refers to a ±10% variation from the nominal value unless otherwise indicated or inferred.

It should be understood that the order of steps or order for performing certain actions is immaterial so long as the present teachings remain operable. Moreover, two or more steps or actions may be conducted simultaneously.

As used herein, "halo" or "halogen" refers to fluoro, chloro, bromo, and iodo.

As used herein, "oxo" refers to a double-bonded oxygen (i.e., =O).

As used herein, "alkyl" refers to a straight-chain or branched saturated hydrocarbon group. Examples of alkyl groups include methyl (Me), ethyl (Et), propyl (e.g., n-propyl and iso-propyl), butyl (e.g., n-butyl, iso-butyl, sec-butyl, tert-butyl), pentyl groups (e.g., n-pentyl, iso-pentyl, neopentyl), hexyl groups, and the like. In various embodiments, an alkyl group can have 1 to 40 carbon atoms (i.e., $C_{1-40}$ alkyl group), for example, 1-20 carbon atoms (i.e., $C_{1-20}$ alkyl group). In some embodiments, an alkyl group can have 1 to 6 carbon atoms, and can be referred to as a "lower alkyl group." Examples of lower alkyl groups include methyl, ethyl, propyl (e.g., n-propyl and iso-propyl), butyl (e.g., n-butyl, iso-butyl, sec-butyl, tert-butyl), and hexyl groups. In some embodiments, alkyl groups can be substituted as described herein. An alkyl group is generally not substituted with another alkyl group, an alkenyl group, or an alkynyl group.

As used herein, "haloalkyl" refers to an alkyl group having one or more halogen substituents. At various embodiments, a haloalkyl group can have 1 to 40 carbon atoms (i.e., $C_{1-40}$ haloalkyl group), for example, 1 to 20 carbon atoms (i.e., $C_{1-20}$ haloalkyl group). Examples of haloalkyl groups include $CF_3$, $C_2F_5$, $CHF_2$, $CH_2F$, $CCl_3$, $CHCl_2$, $CH_2Cl$, $C_2Cl_5$, and the like. Perhaloalkyl groups, i.e., alkyl groups where all of the hydrogen atoms are replaced with halogen atoms (e.g., $CF_3$ and $C_2F_5$), are included within the definition of "haloalkyl." For example, a $C_{1-40}$ haloalkyl group can have the formula —$C_zH_{2z+1-t}X^0_t$, where $X^0$, at each occurrence, is F, Cl, Br or I, z is an integer in the range of 1 to 40, and t is an integer in the range of 1 to 81, provided that t is less than or equal to 2z+1. Haloalkyl groups that are not perhaloalkyl groups can be substituted as described herein.

As used herein, "alkoxy" refers to —O-alkyl group. Examples of alkoxy groups include, but are not limited to, methoxy, ethoxy, propoxy (e.g., n-propoxy and isopropoxy), t-butoxy, pentoxyl, hexoxyl groups, and the like. The alkyl group in the —O-alkyl group can be substituted as described herein.

As used herein, "alkylthio" refers to an —S-alkyl group. Examples of alkylthio groups include, but are not limited to, methylthio, ethylthio, propylthio (e.g., n-propylthio and iso-propylthio), t-butylthio, pentylthio, hexylthio groups, and the like. The alkyl group in the —S-alkyl group can be substituted as described herein.

As used herein, "alkenyl" refers to a straight-chain or branched alkyl group having one or more carbon-carbon double bonds. Examples of alkenyl groups include ethenyl, propenyl, butenyl, pentenyl, hexenyl, butadienyl, pentadienyl, hexadienyl groups, and the like. The one or more carbon-carbon double bonds can be internal (such as in 2-butene) or terminal (such as in 1-butene). In various embodiments, an alkenyl group can have 2 to 40 carbon atoms (i.e., $C_{2-40}$ alkenyl group), for example, 2 to 20 carbon atoms (i.e., $C_{2-20}$ alkenyl group). In some embodiments, alkenyl groups can be substituted as described herein. An alkenyl group is generally not substituted with another alkenyl group, an alkyl group, or an alkynyl group.

As used herein, "alkynyl" refers to a straight-chain or branched alkyl group having one or more triple carbon-carbon bonds. Examples of alkynyl groups include ethynyl, propynyl, butynyl, pentynyl, hexynyl, and the like. The one or more triple carbon-carbon bonds can be internal (such as in 2-butyne) or terminal (such as in 1-butyne). In various embodiments, an alkynyl group can have 2 to 40 carbon atoms (i.e., $C_{2-40}$ alkynyl group), for example, 2 to 20 carbon atoms (i.e., $C_{2-20}$ alkynyl group). In some embodiments, alkynyl groups can be substituted as described herein. An alkynyl group is generally not substituted with another alkynyl group, an alkyl group, or an alkenyl group.

As used herein, "cyclic" refers to an organic closed-ring group including cycloalkyl groups, aryl groups, cycloheteroalkyl groups, and heteroaryl groups as defined herein.

As used herein, "cycloalkyl" refers to a non-aromatic carbocyclic group including cyclized alkyl, cyclized alkenyl, and cyclized alkynyl groups. In various embodiments, a cycloalkyl group can have 3 to 40 carbon atoms (i.e., $C_{3-40}$ cycloalkyl group), for example, 3 to 20 carbon atoms. A cycloalkyl group can be monocyclic (e.g., cyclohexyl) or polycyclic (e.g., containing fused, bridged, and/or spiro ring systems), where the carbon atoms are located inside the ring system. Any suitable ring position of the cycloalkyl group can be covalently linked to the defined chemical structure. Examples of cycloalkyl groups include cyclopropyl, cyclobutyl, cyclopentyl, cyclohexyl, cycloheptyl, cyclopentenyl, cyclohexenyl, cyclohexadienyl, cycloheptatrienyl, norbornyl, norpinyl, norcaryl, adamantyl, and spiro[4.5]decanyl groups, as well as their homologs, isomers, and the like. In some embodiments, cycloalkyl groups can be substituted as described herein.

As used herein, "heteroatom" refers to an atom of any element other than carbon or hydrogen and includes, for example, nitrogen, oxygen, silicon, sulfur, phosphorus, and selenium.

As used herein, "cycloheteroalkyl" refers to a non-aromatic cycloalkyl group that contains at least one ring heteroatom selected from O, S, Se, N, P, and Si (e.g., O, S, and N), and optionally contains one or more double or triple bonds. A cycloheteroalkyl group can have 3 to 40 ring atoms (i.e., 3-40 membered cycloheteroalkyl group), for example, 3 to 20 ring atoms. One or more N, P, S, or Se atoms (e.g., N or S) in a cycloheteroalkyl ring may be oxidized (e.g., morpholine N-oxide, thiomorpholine S-oxide, thiomorpholine S,S-dioxide). In some embodiments, nitrogen or phosphorus atoms of cycloheteroalkyl groups can bear a substituent, for example, a hydrogen atom, an alkyl group, or other substituents as described herein. Cycloheteroalkyl groups can also contain one or more oxo groups, such as oxopiperidyl, oxooxazolidyl, dioxo-(1H,3H)-pyrimidyl, oxo-2(1H)-pyridyl, and the like. Examples of cycloheteroalkyl groups include, among others, morpholinyl, thiomorpholinyl, pyranyl, imidazolidinyl, imidazolinyl, oxazolidinyl, pyrazolidinyl, pyrazolinyl, pyrrolidinyl, pyrrolinyl, tetrahydrofuranyl, tetrahydrothiophenyl, piperidinyl, piperazinyl, and the like. In some embodiments, cycloheteroalkyl groups can be substituted as described herein.

As used herein, "aryl" refers to an aromatic monocyclic hydrocarbon ring system or a polycyclic ring system in which two or more aromatic hydrocarbon rings are fused (i.e., having a bond in common with) together or at least one aromatic monocyclic hydrocarbon ring is fused to one or more cycloalkyl and/or cycloheteroalkyl rings. An aryl group can have 6 to 40 carbon atoms in its ring system, which can include multiple fused rings. In some embodiments, a polycyclic aryl group can have from 8 to 40 carbon atoms. Any suitable ring position of the aryl group can be covalently linked to the defined chemical structure. Examples of aryl groups having only aromatic carbocyclic ring(s) include phenyl, 1-naphthyl (bicyclic), 2-naphthyl (bicyclic), anthracenyl (tricyclic), phenanthrenyl (tricyclic), and like groups. Examples of polycyclic ring systems in which at least one aromatic carbocyclic ring is fused to one or more cycloalkyl and/or cycloheteroalkyl rings include, among others, benzo derivatives of cyclopentane (i.e., an indanyl group, which is a 5,6-bicyclic cycloalkyl/aromatic ring system), cyclohexane (i.e., a tetrahydronaphthyl group, which is a 6,6-bicyclic cycloalkyl/aromatic ring system), imidazoline (i.e., a benzimidazolinyl group, which is a 5,6-bicyclic cycloheteroalkyl/aromatic ring system), and pyran (i.e., a chromenyl group, which is a 6,6-bicyclic cycloheteroalkyl/aromatic ring system). Other examples of aryl groups include benzodioxanyl, benzodioxolyl, chromanyl, indolinyl groups, and the like. In some embodiments, aryl groups can be substituted as described herein. In some embodiments, an aryl group can have one or more halogen substituents, and can be referred to as a "haloaryl" group. Perhaloaryl groups, i.e., aryl groups where all of the hydrogen atoms are replaced with halogen atoms (e.g., —$C_6F_5$), are included within the definition of "haloaryl." In certain embodiments, an aryl group is substituted with another aryl group and can be referred to as a biaryl group. Each of the aryl groups in the biaryl group can be substituted as disclosed herein.

As used herein, "heteroaryl" refers to an aromatic monocyclic ring system containing at least one ring heteroatom selected from oxygen (O), nitrogen (N), sulfur (S), silicon (Si), and selenium (Se) or a polycyclic ring system where at least one of the rings present in the ring system is aromatic and contains at least one ring heteroatom. Polycyclic heteroaryl groups include two or more heteroaryl rings fused together and monocyclic heteroaryl rings fused to one or more aromatic carbocyclic rings, non-aromatic carbocyclic rings, and/or non-aromatic cycloheteroalkyl rings. A heteroaryl group, as a whole, can have, for example, 5 to 40 ring atoms and contain 1-5 ring heteroatoms. The heteroaryl group can be attached to the defined chemical structure at any heteroatom or carbon atom that results in a stable structure. Generally, heteroaryl rings do not contain O—O, S—S, or S—O bonds. However, one or more N or S atoms in a heteroaryl group can be oxidized (e.g., pyridine N-oxide, thiophene S-oxide, thiophene S,S-dioxide). Examples of heteroaryl groups include, for example, the 5- or 6-membered monocyclic and 5-6 bicyclic ring systems shown below:

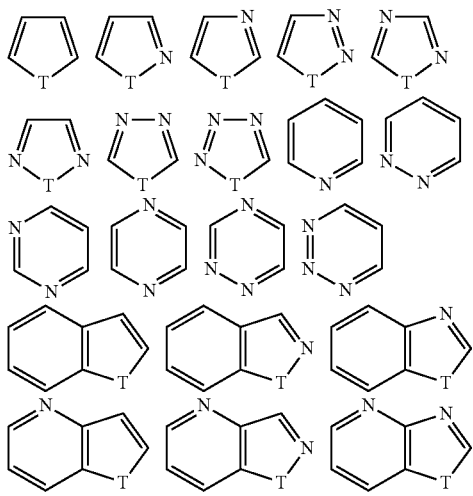

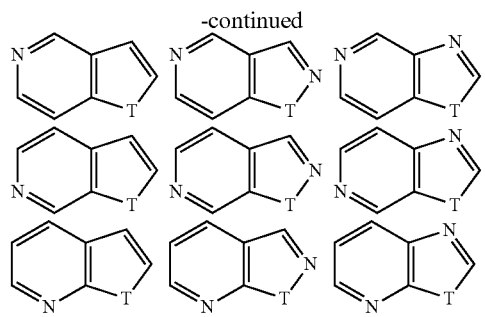

where T is O, S, NH, N-alkyl, N-aryl, N-(arylalkyl) (e.g., N-benzyl), $SiH_2$, SiH(alkyl), Si(alkyl)$_2$, SiH(arylalkyl), Si(arylalkyl)$_2$, or Si(alkyl)(arylalkyl). Examples of such heteroaryl rings include pyrrolyl, furyl, thienyl, pyridyl, pyrimidyl, pyridazinyl, pyrazinyl, triazolyl, tetrazolyl, pyrazolyl, imidazolyl, isothiazolyl, thiazolyl, thiadiazolyl, isoxazolyl, oxazolyl, oxadiazolyl, indolyl, isoindolyl, benzofuryl, benzothienyl, quinolyl, 2-methylquinolyl, isoquinolyl, quinoxalyl, quinazolyl, benzotriazolyl, benzimidazolyl, benzothiazolyl, benzisothiazolyl, benzisoxazolyl, benzoxadiazolyl, benzoxazolyl, cinnolinyl, 1H-indazolyl, 2H-indazolyl, indolizinyl, isobenzofuyl, naphthyridinyl, phthalazinyl, pteridinyl, purinyl, oxazolopyridinyl, thiazolopyridinyl, imidazopyridinyl, furopyridinyl, thienopyridinyl, pyridopyrimidinyl, pyridopyrazinyl, pyridopyridazinyl, thienothiazolyl, thienoxazolyl, thienoimidazolyl groups, and the like. Further examples of heteroaryl groups include 4,5,6,7-tetrahydroindolyl, tetrahydroquinolinyl, benzothienopyridinyl, benzofuropyridinyl groups, and the like. In some embodiments, heteroaryl groups can be substituted as described herein.

Compounds of the present teachings can include a "multivalent group" defined herein as a linking group capable of forming a covalent bond with multiple moieties. For example, a divalent group can form a covalent bond with two moieties, while a trivalent group can form a covalent bond with three moieties, and a tetravalent group can form a covalent bond with four moieties.

At various places in the present specification, substituents on a chemical group are disclosed in groups or in ranges. It is specifically intended that the description include each and every individual subcombination of the members of such groups and ranges. For example, the term "$C_{1-6}$ alkyl" is specifically intended to individually disclose $C_1$, $C_2$, $C_3$, $C_4$, $C_5$, $C_6$, $C_1$-$C_6$, $C_1$-$C_5$, $C_1$-$C_4$, $C_1$-$C_3$, $C_1$-$C_2$, $C_2$-$C_6$, $C_2$-$C_5$, $C_2$-$C_4$, $C_2$-$C_3$, $C_3$-$C_6$, $C_3$-$C_5$, $C_3$-$C_4$, $C_4$-$C_6$, $C_4$-$C_5$, and $C_5$-$C_6$ alkyl. By way of other examples, an integer in the range of 0 to 40 is specifically intended to individually disclose 0, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, and 40, and an integer in the range of 1 to 20 is specifically intended to individually disclose 1, 2, 3, 4, 5, 6, 7, 8, 9, 10, 11, 12, 13, 14, 15, 16, 17, 18, 19, and 20. Additional examples include that the phrase "optionally substituted with 1-5 substituents" is specifically intended to individually disclose a chemical group that can include 0, 1, 2, 3, 4, 5, 0-5, 0-4, 0-3, 0-2, 0-1, 1-5, 1-4, 1-3, 1-2, 2-5, 2-4, 2-3, 3-5, 3-4, and 4-5 substituents.

As used herein, a "p-type semiconductor material" or a "p-type semiconductor" refers to a semiconductor material having holes as the majority current carriers. In some embodiments, when a p-type semiconductor material is deposited on a substrate, it can provide a hole mobility in excess of about $10^{-5}$ cm²/Vs. In the case of field-effect devices, a p-type semiconductor can also exhibit a current on/off ratio of greater than about 10.

As used herein, an "n-type semiconductor material" or an "n-type semiconductor" refers to a semiconductor material having electrons as the majority current carriers. In some embodiments, when an n-type semiconductor material is deposited on a substrate, it can provide an electron mobility in excess of about $10^{-5}$ cm²/Vs. In the case of field-effect devices, an n-type semiconductor can also exhibit a current on/off ratio of greater than about 10.

As used herein, a "dielectric material" has a conductivity in the order of $10^{-6}$ Scm$^{-1}$ or less to avoid current leakage to an adjacent electrical conductor.

It will be understand that when two components are described as being coupled to each other, the two components can be directly in contact (e.g., directly coupled to each other), or the two components can be coupled to each other via one or more intervening components or layers.

Throughout the specification, structures may or may not be presented with chemical names. Where any question arises as to nomenclature, the structure prevails.

In one aspect, the present teachings provide dendritic macromolecules having end groups that include at least one cyclic group. In other words, the dendritic macromolecules have branched ends that are functionalized with organic groups that include one or more cyclic groups. As described in further detail below, the cyclic group can be monocyclic or polycyclic (fused, spiro, or bridged), can be carbocyclic or include one or more heteroatoms, can be completely saturated or include one or more unsaturated bonds, and can be unsubstituted or substituted with one or more functional groups.

As used herein, the term "dendritic macromolecule" refers to dendrimers, hyperbranched polymers (HBPs), and other repeated branched polymers such as star-shaped and star-branched polymers. The basic structure of a dendritic macromolecule includes a multivalent initiator core and a plurality of generations of branches extending from the core, which leads to a compact globular or quasi-globular structure with a large number of end groups per molecule. The number of branch points increases upon moving from the initiator core towards the end groups and defines generations. As used herein, the term "generations" encompasses pseudo-generations, in particular, when used in the context of hyperbranched polymers. Dendrimers typically are prepared via stepwise synthesis, which gives rise to a highly regular branching pattern, a definite molecular weight, a low polydispersity index and a well-defined number of end groups. Compared to dendrimers, the synthesis of hyperbranched polymers can be less strictly controlled, and many hyperbranched polymers can be prepared using a one-pot process, which make them preferable to dendrimers in many applications. While hyperbranched polymers have irregular branches and a broader molecular weight distribution, they do conserve the essential features of dendrimers, namely a high degree of end-group functionality and a globular architecture. In addition to exterior functionalities (i.e., end groups at the periphery of the molecule), dendritic macromolecules also can have interior functionalities.

In general, dendritic macromolecules such as dendrimers and hyperbranched polymers can have an average of at least 16 end groups per molecule for second-generation materials (the branches immediately attached to the initiator core are considered zero-generation), increasing by a factor of at least 2 for each successive generation. Number average molar masses of second-generation dendrimers or hyperbranched polymers usually are greater than about 1500 g/mol, and the molar masses increase exponentially per generation, reaching about 8000 g/mol for a fourth-generation polymer. Typically, the molecular weight of a dendritic macromolecule can be about 100 g/mol per end group, although this will vary according to the exact formulation. In various embodiments, the present dendritic macromolecules can have two, three, four, five, six, seven or more generations, and the number of end groups per dendritic macromolecule can range from 12 to about 1,000.

The well-defined and three-dimensional character of dendritic macromolecules leads to properties quite different from those of their linear counterparts. More specifically, dendritic macromolecules can be characterized by unusual properties such as (1) less flexibility/molecular fragment motion, (2) lower entanglement degree, and, very relevant to the materials disclosed herein, (3) a significant chain-end effect.

In various embodiments, the present dendritic macromolecule can be a dendrimer or hyperbranched polymer including a polymerized product of one or more repeating units which, upon conventional (i.e., linear) polymerization can provide a dielectric polymer associated with a high dielectric constant, i.e., a dielectric constant of at least 2.5, preferably larger than 3. For example, the monomers of polyacrylates such as poly(methyl methacrylate) (PMMA); polyolefins such as poly(vinyl phenol) (PVP), poly(vinyl chloride) (PVC), poly(vinyl alcohol) (PVA), and poly(vinylidene fluoride) (PVDF); cyanated polysaccharides such as polycyanopullulan, poly(cyanoethylated pullulan), cyanoethylated cellulose, and cyanated poly(vinyl alcohol); polysiloxanes; polyimides such as polymaleimides; aliphatic polyethers such as poly(ethylene glycol) and polypropylene glycol); polyesters such as poly(ethylene terephthalate); polyamines; polyamides; polyimines; polyurethanes; and combinations thereof can be included as repeating units in the present dendritic macromolecules. In certain embodiments, the present dendritic macromolecules can be a dendrimer or hyperbranched polymer other than a polysiloxane dendrimer or a hyperbranched polysiloxane.

Unlike linear polymers, the branching of the present dendritic macromolecules is enabled by multifunctional monomers, which serve as branching agents and provide the branch points in the dendritic macromolecules. For example, the branching agents can include three or more functional groups independently selected from hydroxyl groups, amino groups, vinyl groups, alkynyl groups, azido groups, thiol groups, epoxy groups, carboxylic acid groups including acyl halides and anhydrides, and combinations thereof.

Various initiators can be used to prepare the present dendritic macromolecules. For example, the initiator can be a multivalent compound having multiple hydroxyl groups such as:

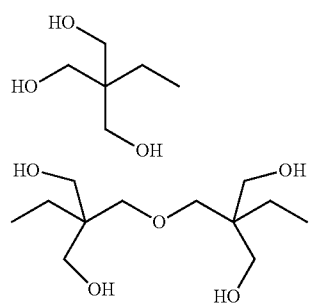

-continued

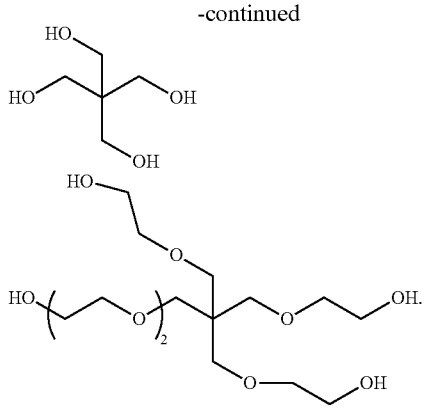

In other embodiments, the initiator can have multiple amine groups and/or carboxylic acid groups. For example, the initiator can be:

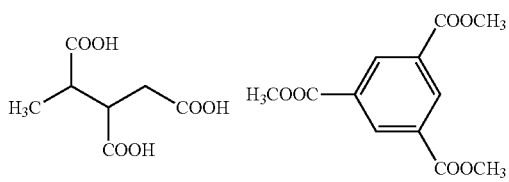

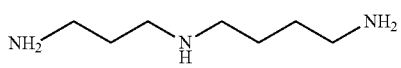

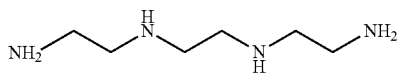

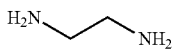
Ethylenediamine (2-carbon core)

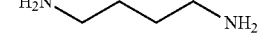
1, 12-diaminododecane (12-carbon core)

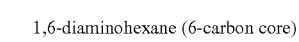
1,4-diaminobutane (4-carbon core)

Crystamine core (cleavable core)

1,6-diaminohexane (6-carbon core)

Various types of polymerization chemistry can be used to prepare the present dendritic macromolecules, including condensation, anionic additional polymerization, controlled free radical polymerization (e.g., atom transfer radical polymerization), and controlled ring opening reactions. For example, hyperbranched polyesters and copolymers thereof can be prepared by condensation of one or more self-condensable monomers, where the monomers can have one hydroxyl group and two or three carboxylic acid groups, or one carboxylic acid group and two or three hydroxyl groups. One common example of such a self-condensable monomer is bis-hydroxymethyl propionic acid (bis-MPA or dimethylolpropionic acid (DMPA)). Hyperbranched polyesters also can be obtained by controlled ring opening of cyclic precursors such as lactones and lactides, or polymerization of multifunctional vinyl ester derivatives.

In various embodiments, the present dendritic macromolecule can be a dendrimer or hyperbranched polymer other than a polysiloxane dendrimer or a hyperbranched polysiloxane. In certain embodiments, the present dendritic macromolecule can be selected from polyester, polyamide, polyether, polyamine, polyurethane, polyolefin, polyimide, polycarbosilane, and copolymers thereof. In particular embodiments, the present dendritic macromolecule can be a non-silicon-based polymer. For example, the present dendritic macromolecule can be a dendrimer or hyperbranched polymer selected from poly(amido-amine), poly(amide-ester), poly(amine-ester), and poly(ether-ester). The repeating units in the dendritic macromolecule can include aliphatic and/or aromatic groups. In certain embodiments, the present dendritic macromolecule can include at least one non-aromatic repeating unit. For example, the present dendritic macromolecule can include both aliphatic and aromatic repeating units. In particular embodiments, the present dendritic macromolecule can include only non-aromatic repeating units.

In certain embodiments, the present dendritic macromolecule can be a hyperbranched polyester or poly(ether-ester) derived from an initiator having three or more hydroxyl groups. For example, the present dendritic macromolecule can be derived from a pentaerythritol core:

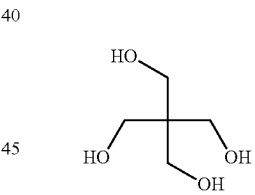

or an ethoxylated pentaerythritol core with branches comprising residues of bis-MPA

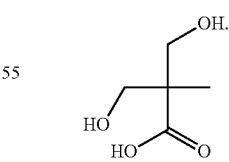

Other suitable dendritic macromolecules include poly(amidoamine) (PAMAM) dendrimers or hyperbranched polymers, poly(propylene-imine) dendrimers or hyperbranched polymers, and poly(amide-ester) dendrimers or hyperbranched polymers such as those described in International Publication No. WO 2009/136853, the entire disclosure of which is incorporated by reference herein.

Specific examples of dendritic macromolecules that can be functionalized according to the present teachings include
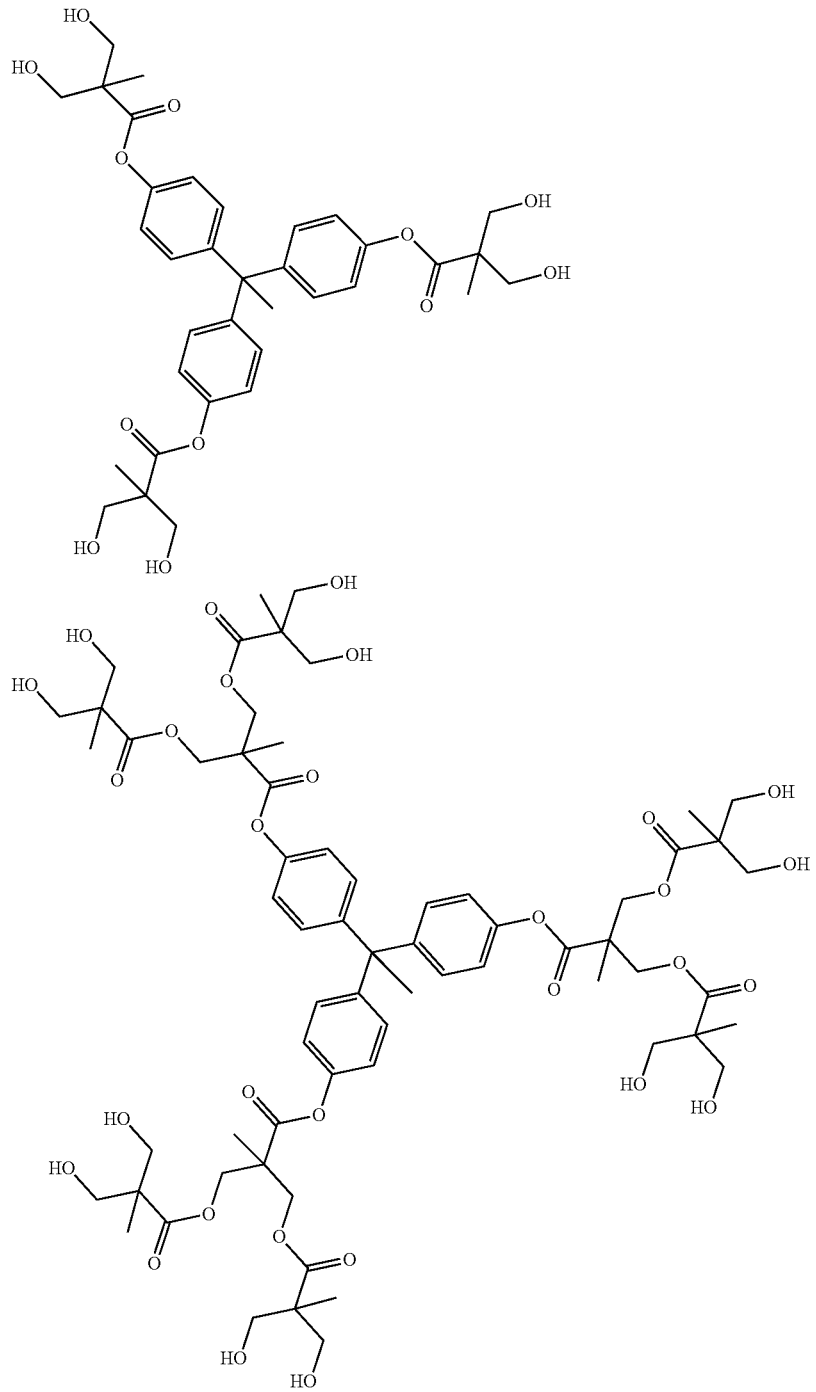

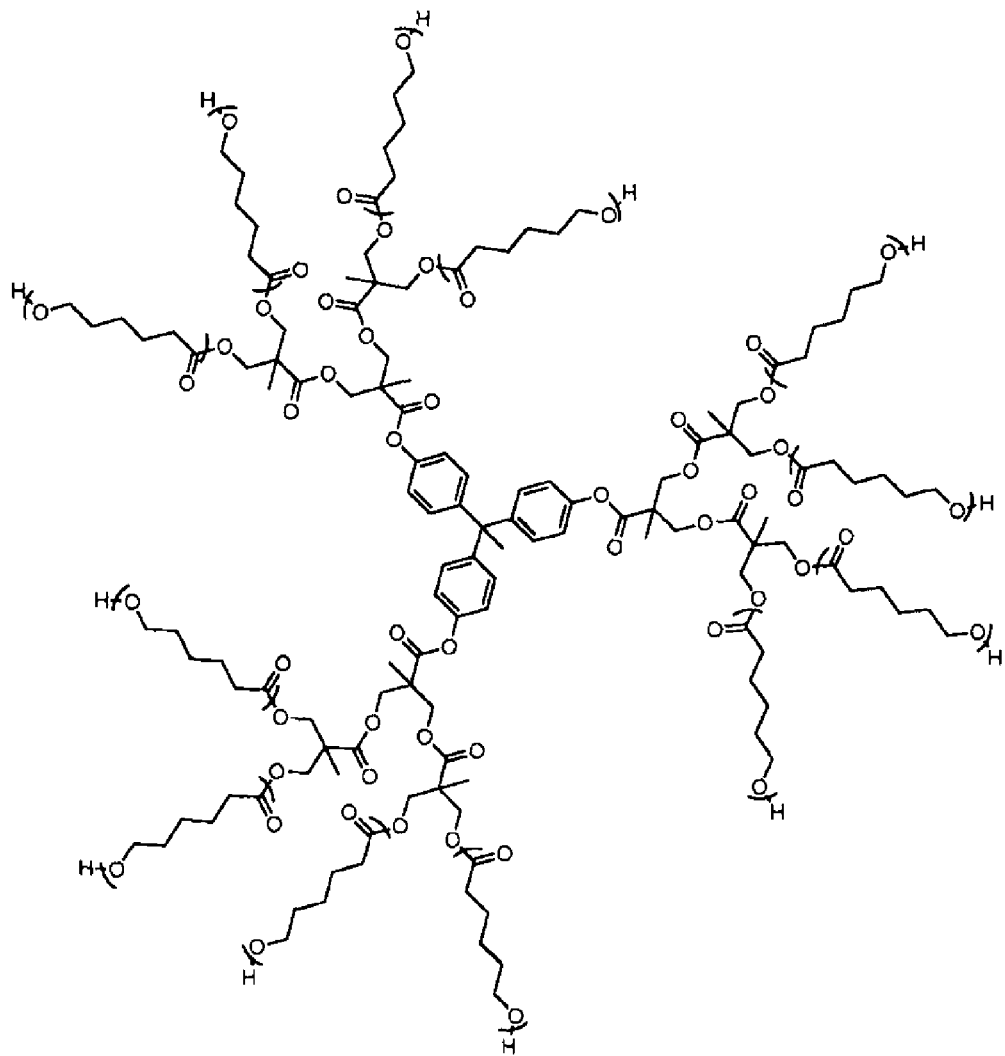

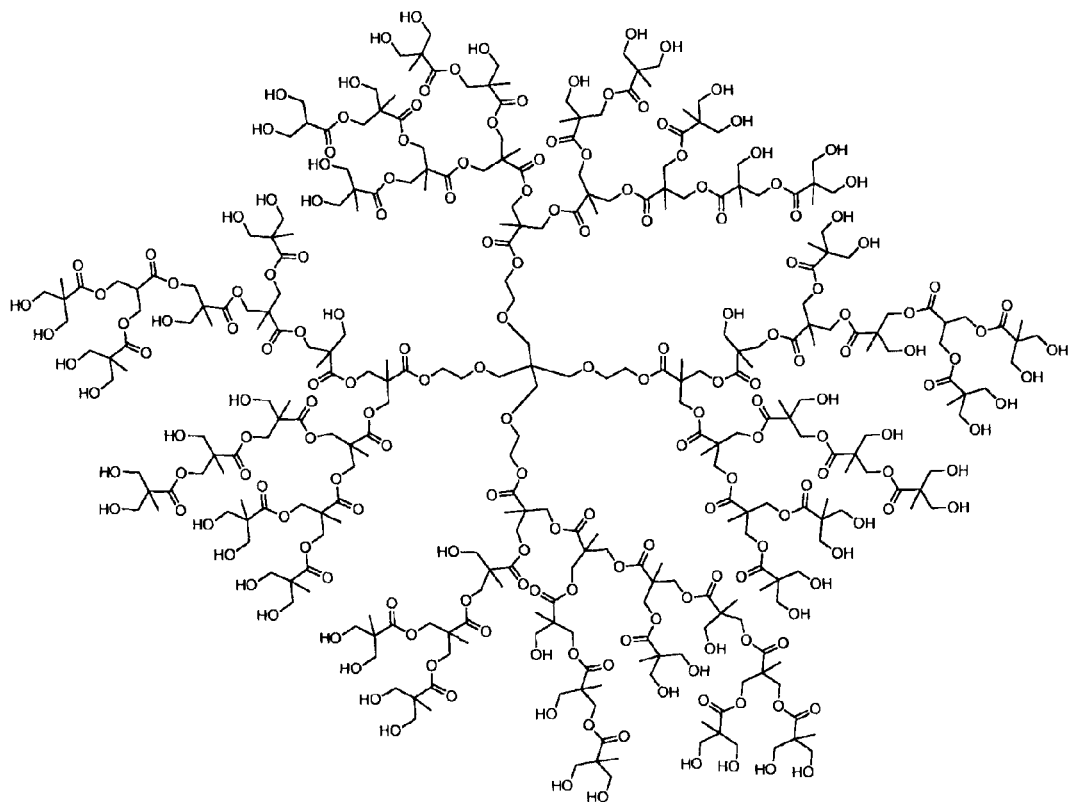

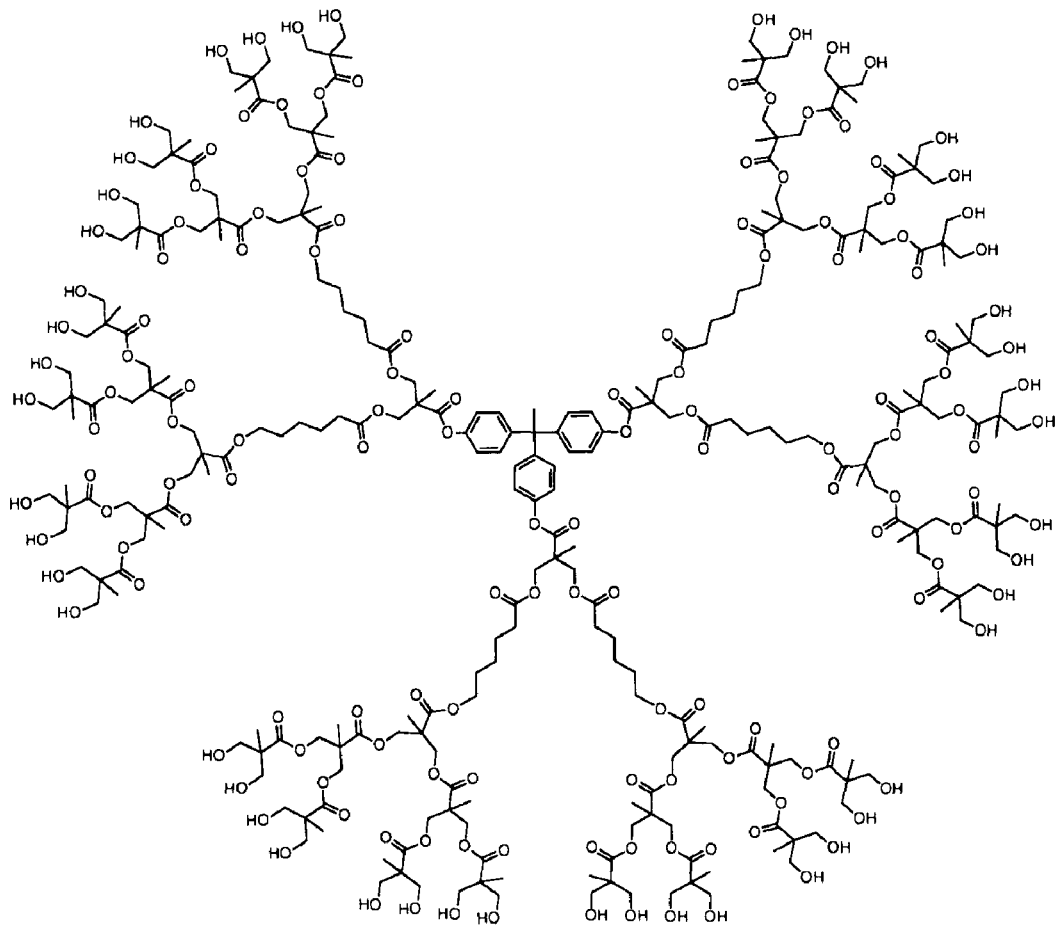

The present dendritic macromolecules have branched ends that are functionalized with organic groups that include one or more cyclic groups. For example, each of the end groups can include one, two, three or four optionally substituted cyclic groups. In embodiments where an end group includes two or more cyclic groups, the cyclic groups can be covalently bonded to each other directly or via a linker group, or the cyclic groups can be attached to a common atom directly or via a linker group. For example, one of the cyclic groups can function as a linker group. As described above, each cyclic group can be monocyclic or polycyclic. Polycyclic groups can have 2-10 rings where the rings are fused or connected by one or more spiro atoms or bridged groups. Each cyclic group can be carbocyclic or can include one or more heteroatoms (e.g., O, S, and/or N). Also, each cyclic group can be completely saturated or include one or more unsaturated (double or triple) bonds. In addition, each cyclic group can be unsubstituted or substituted with one or more functional groups.

In certain embodiments, the present dendritic macromolecules have branched ends that are functionalized with organic groups that include one, two, three, or four optionally substituted 3-40 membered cyclic groups. The organic group as a whole can have 3-100 carbon atoms. Each cyclic group optionally can be substituted with 1-5 substituents, where the optional substituents independently can be selected from halogens (e.g., Cl, F), CN, OH, $C_{1-10}$ alkyl groups, $C_{2-10}$ alkenyl groups, $C_{2-10}$ alkynyl groups, $C_{1-10}$ haloalkyl groups, $C_{1-10}$ alkoxyl groups, and $C_{1-10}$ alkylthio groups.

In some embodiments, the organic group can be entirely non-aromatic, that is, the organic group does not include any aryl or heteroaryl groups. For example, each of the cyclic groups in the organic group can be an optionally substituted $C_{3-40}$ cycloalkyl group. In particular embodiments, the organic group can include one, two, three or four $C_{3-40}$ cycloalkyl groups, each of which optionally can be substituted with 1-5 $C_{1-10}$ alkyl groups and/or $C_{2-10}$ alkenyl groups.

Illustrative cycloalkyl moieties include cyclopropane, cyclobutane, cyclopentane, cyclohexane, cycloheptane, bicyclobutane, bicyclopentane, bicyclohexane (e.g., norbornane, norpinane, norcarane), bicycloheptane, bicyclooctane, bicyclononane, bicyclodecane, bicycloundecane, various steranes, and cage compounds such as adamantane, cubane, and prismane. Additional examples of optionally substituted cycloalkyl moieties and cycloalkyl moieties that include at least one unsaturated bond include cyclopentene, cyclohexene, cyclohexadiene, cycloheptatriene, norbornene, and completely or partially hydrogenated analogs of toluene, xylene, naphthalene, anthracene, phenanthrene, cyclopentaphenanthrene, pyrene, benzopyrene, chrysene, naphthacene, pentacene, pentalene, fluoranthene, benzofluoranthene, fluorene, benzofluorene, perylene, picene, coronene, corannulene, triphenylene, and ovalene. In certain embodiments, the cycloalkyl moieties can be partially fluorinated or perfluorinated.

In some embodiments, the organic group can include two or more cyclic groups which are covalently bonded to each other directly or via a linker group. In some embodiments, the organic group can include two or more cyclic groups which are attached to a common atom directly or via a linker group. The common atom typically is carbon, but in some embodiments, two or more cyclic groups can be attached to a common heteroatom such as N or P which optionally can be oxidized. In certain embodiments, the organic group can include a cyclic group substituted with two or three cyclic groups.

Examples of non-aromatic end groups include:

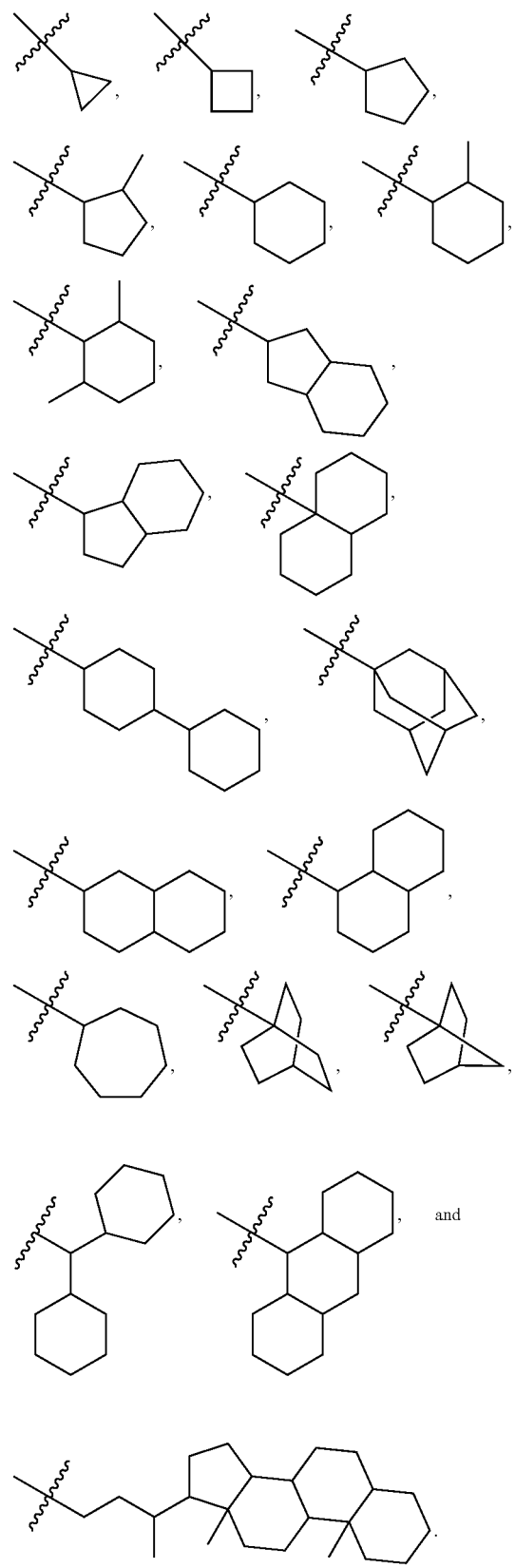

and

Examples of organic groups having two cycloalkyl moieties attached to a common heteroatom include:

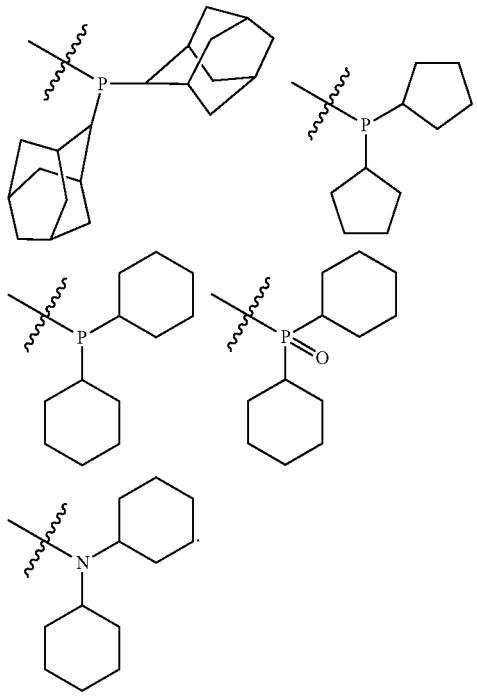

In certain embodiments, the present dendritic macromolecules have branched ends that are functionalized with a crosslinkable organic group, for example, a photo- and/or thermally crosslinkable organic group, where the organic group includes one, two, three, or four optionally substituted 3-40 membered cyclic groups as described above. In various embodiments, one or more cyclic groups in the crosslinkable organic group can be photo- and/or thermally crosslinkable. For example, a cyclic group can be photocrosslinkable because of the presence of one or more unsaturated bonds within the ring. In other examples, a cyclic group can be thermally crosslinkable because of the presence of thermally labile groups within the ring. More generally, the crosslinkable organic group can include a photo/thermally crosslinkable linker, a photo/thermally crosslinkable cyclic group, a cyclic group that is substituted with one or more photo/thermally crosslinkable groups, or combinations thereof. Examples of photocrosslinkable substituents include $C_{2-10}$ alkenyl groups, $C_{2-10}$ alkynyl groups, and azido groups. Examples of photocrosslinkable linkers include divalent $C_{2-10}$ alkenyl groups, divalent $C_{2-10}$ alkynyl groups, and azido linker groups. The photocrosslinking chemistry can involve a 2+2 photo-stimulated cycloaddition that provides stable cyclobutane moieties. The photocrosslinking chemistry also can involve free radical additions affording C—C and C—O bonds. Dendritic macromolecules according to these embodiments can be cured by exposure to ultraviolet light, for example, at a wavelength of about 250-500 nm (e.g., between about 300 nm and about 450 nm). Photocrosslinking also can be achieved by other types of radiation, for example, with ion beams of charged particles, and electron beams with radioactive sources.

Examples of photocrosslinkable end groups include:

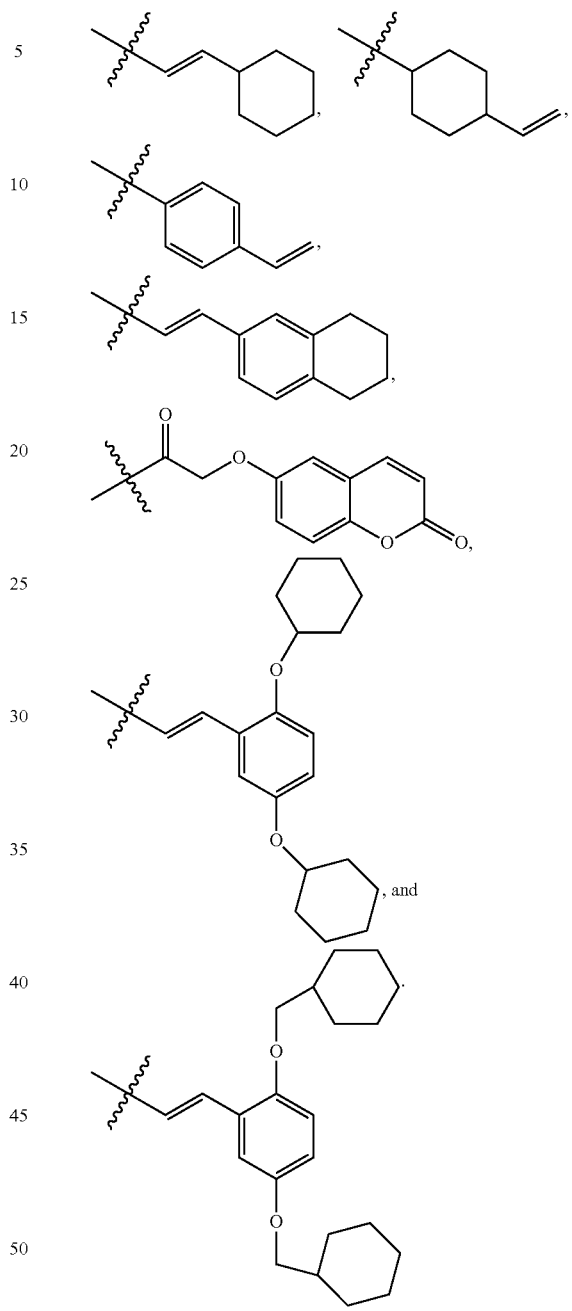

In some embodiments, the one or more cyclic groups can be thermally crosslinkable. The thermal crosslinking can be initiated by high temperature or by radical initiators such as azobisisobutyronitrile (AIBN), photoacid generators such as triphenylsulfonium triflate, radical photoinitiators such as diphenyl(2,4,6-trimethylbenzoyl)phosphine oxide (TPO), or photosensitizers such as benzophenone. However, the thermally-induced process should occur at a low temperature, typically lower than about 300° C. but preferably lower than about 200° C., to avoid chemical decomposition of the dendrimer core. Dendritic macromolecules according to these embodiments can be cured at a temperature below about 300° C., and in certain embodiments, as low as about 120° C., according to the chemistries of the employed groups.

Examples of thermally crosslinkable end groups include:

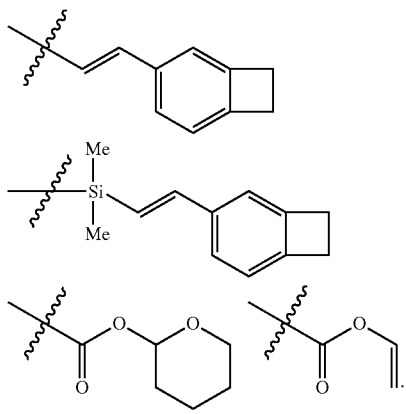

Generally, dendritic macromolecules according to the present teachings can be described by the formula:

wherein:
D is the residue of a dendrimer or hyperbranched polymer;
L is a covalent bond or a linker group;
$R^1$ is an organic group comprising one, two, three or four 3-40 membered optionally substituted cyclic groups; and
n is an integer in the range of 12-1024.

In various embodiments, D can be the residue of a dendrimer or hyperbranched polymer other than a polysiloxane dendrimer or a hyperbranched polysiloxane. In various embodiments, D can be the residue of a dendrimer or hyperbranched polymer including at least one non-aromatic repeating units. In certain embodiments, D can be the residue of an aliphatic-aromatic dendrimer or an aliphatic-aromatic hyperbranched polymer. In particular embodiments, D can be the residue of an aliphatic dendrimer or an aliphatic hyperbranched polymer. For example, D can be the residue of a dendrimer or hyperbranched polymer selected from an aliphatic polyester, an aliphatic-aromatic polyester, an aliphatic polyamide, an aliphatic-aromatic polyamide, an aliphatic polyether, an aliphatic-aromatic polyether, an aliphatic polyamine, an aliphatic-aromatic polyamine, an aliphatic polyurethane, an aliphatic-aromatic polyurethane, an aliphatic polyolefin, an aliphatic-aromatic polyolefin, an aliphatic polyimide, an aliphatic-aromatic polyimide, and copolymers thereof.

The present dendritic macromolecules can be obtained by reacting a hyperbranched polymer or a dendrimer including initial end groups (referred herein as first reactive groups) that are reactive to a compound of the formula $X-R^1$, where X is a second reactive group that can react with a first reactive group to provide a covalent bond or a linker group such as —O—, —C(O)—, —OC(O)—, —NR—, —NRC(O)—, —O—SiR$_2$—, -Ph-, -Ph-O—, -PhCH$_2$—, -PhCH$_2$—O—, -1,2,3-triazolo-, —RC=CR—, —C≡C—, —SO$_2$—, and —S(O)—, where R is H or a $C_{1-6}$ alkyl group, Ph is a divalent phenyl group, and $R^1$ is the chemical group comprising one or more cyclic groups as described herein. In certain embodiments, the linker group can provide a polar sigma bond between the core (initiator core+generations of branches) of the dendritic macromolecule and the end groups.

The functionalization of the dendritic macromolecule with $R^1$ can be carried out using various chemistries known in the art including substitution reactions such as esterification (reaction between a hydroxyl group and a carboxylic acid derivative to provide an ester linker group), additional reactions including click chemistry (e.g., cycloaddition between an azide and an alkyne to provide a 1,2,3-triazolo-linker group), and so forth. In particular, when the first reactive groups (i.e., initial end groups on the dendritic macromolecules) are hydroxyl groups, functionalization with $R^1$ can be carried out through a variety of coupling reactions. The hydroxyl groups can be used as nucleophiles directly or converted to alkoxy anions using strong bases to increase the reactivity. In each case, the hydroxy groups are transformed by the addition of the reactive electrophiles (X) in the compound $X-R^1$.

In certain embodiments, the present dendritic macromolecules can be at least a second-generation (G2) dendrimer or hyper-branched polymer, and include at least 16 end groups. In particular embodiments, the present dendritic macromolecules can be at least a third-generation (or pseudo-generation) (G3) dendrimer or hyper-branched polymer, and include at least 32 end groups. Accordingly, in embodiments where the dendritic macromolecule has a tetravalent initiator and each generation branches into two sub-branches, n can be 16 (G2), 32 (G3), 64 (G4), 128 (G5), 256 (G6), 512 (G7), or 1024 (G8). In embodiments where the dendritic macromolecule has a trivalent initiator and each generation branches into two sub-branches, n can be 12 (G2), 24 (G3), 48 (G4), 96 (G5), and so forth. With hyperbranched polymers, the irregular branching pattern can lead to slight variations from the theoretical number of end groups. In various embodiments, the present dendritic macromolecules can have a molecular weight (or average molecular weight) between about 1,000 and about 1,000,000 Da.

The dendritic macromolecules can be mobilized in a liquid medium to provide a composition for forming a dielectric material (which can be referred herein as a "dielectric composition"). The composition can be a solution, a dispersion, a suspension, an emulsion, or a gel, although in most embodiments, the composition is a solution or a dispersion suitable for solution-phase processes. The liquid medium can include solid and/or gaseous components, and that the liquid medium can be in a vapor or gaseous form. As such, the term "liquid medium" can include a vaporized liquid medium. The term "mobilized in a liquid medium" broadly means that the designated liquid medium causes a designated solid to take on properties of a liquid or vapor. For example, the solid can be dissolved in the liquid medium to form a single-phase solution, or the solid can be dispersed in the liquid medium to form a two-phase dispersion. In other embodiments, the solid and the liquid medium can be combined together to form an emulsion, a suspension, a gel, or even micelles. As used herein, the term "solution" means that a substantial proportion of a designated solute has formed a single phase with a designated solvent, but a substantial solid, liquid and/or gaseous second phase that can include dispersed particulate matter also can be present.

The present dendritic macromolecules can have satisfactory solubility in various common organic solvents to afford a composition for forming a dielectric material via solution-phase processes. In certain embodiments, the present dendritic macromolecules can have satisfactory solubility in organic solvents that are orthogonal to those solvents (e.g., aromatic or polar chlorinated solvents) typically used to process common organic semiconducting molecules or polymers. Examples of organic solvents that can be used to formulate the dendritic macromolecules include alcohol solvents such as methanol, ethanol, isopropanol, 1-butanol, 2-ethoxymethanol, 3-methoxypropanol, cyclopentanol, cyclohexanol, and heptanol; ketone solvents such as acetone, acetylacetone, methyl ethyl ketone, methyl isobutyl ketone, 2-pentanone, 3-pentanone, 2-heptanone, 3-heptanone, cyclopentanone, and cyclohexanone; ester solvents such as ethyl acetate, propyl acetate, butyl acetate, isobutyl acetate, pentyl acetate, cyclohexyl acetate, heptyl acetate, ethyl propionate, propyl propionate, butyl propionate, isobutyl propionate, propylene glycol monomethyl ether acetate, methyl lactate, ethyl lactate and γ-butyrolactone; ether solvents such as diisopropyl ether, dibutyl ether, ethyl propyl ether, anisole, phenetole, and veratrole; aliphatic hydrocarbons such as hexanes, cyclopentane, cyclohexane, n-nonane, n-decane, n-undecane, n-dodecane; and amide solvents such as N-methylpyrrolidinone and dimethylacetamide. These solvents can be used either singly or in combination, or as mixtures with water. The solubility characteristics of the present dendritic macromolecules, therefore, can allow the fabrication of a device that includes a solution-processed dielectric material and a solution-processed organic semiconductor material, with the use of orthogonal solvents.

As used herein, "solution-processable" or "solution-processed" refers to the ability of a compound, for example, the present dendritic macromolecules, to be processed via various solution-phase processes including spin-coating, printing (e.g., inkjet printing, screen printing, pad printing, offset printing, gravure printing, flexographic printing, lithographic printing, mass-printing and the like), spray coating, electrospray coating, drop casting, dip coating, and blade coating.

In addition to the present dendritic macromolecules, the dielectric composition (and the resulting dielectric material) can include other components that can be used to selectively modify one or more properties (e.g., viscosity, dielectric properties, thermal stability, glass transition temperature) of the dielectric material to be formed.

In some embodiments, the dielectric composition according to the present teachings can include inorganic materials such as $SiO_2$ and/or one or more high-k inorganic materials. High-k inorganic materials include binary, ternary and/or quaternary metal oxides such as $Al_2O_3$ ($k_{bulk}$=9), ($TiO_2$ ($k_{bulk}$=41), $HfO_2$, ($k_{bulk}$=25), $Gd_2O_3$($k_{bulk}$=7), and $Ba_xSr_1$-x $TiO_3$ ($k_{bulk}$=15-20). Ceramic having a perovskite structure represented by $ABO_3$ also can be used. Examples include $BaTiO_3$, $PbTiO_3$, $PbZrO_3$, $Pb(Ti,Zr)O_3$, $Pb(Mn,Nb)O_3$, $SrTiO_3$, $CaTiO_3$, and $MgTiO_3$.

In some embodiments, the dielectric composition according to the present teachings can include one or more linear dielectric polymers. For example, the one or more linear dielectric polymers can be selected from fluorinated paraxylene, fluoropolyarylether, fluorinated polyimide, polystyrene, poly(α-methyl styrene), poly(α-vinylnaphthalene), poly(vinyltoluene), polyethylene, cis-polybutadiene, polypropylene, polyisoprene, poly(4-methyl-1-pentene), poly(tetrafluorethylene), poly(chlorotrifluoroethylene), poly(2-methyl-1,3-butadiene), poly(p-xylylene), poly(α-α-α'-α'-tetrafluoro-p-xylylene), poly[1,1-(2-methyl propane) bis(4-phenyl) carbonate], poly(cyclohexyl methacrylate), poly(4-chlorostyrene), poly(2,6-dichlorostyrene), poly(4-bromostyrene), poly(2,6-dimethyl-1,4-phenylene ether), polyisobutylene, poly(vinyl cyclohexane), poly(arylene ether), polyphenylene, poly(ethylene/tetrafluoroethyelene), poly(ethylene/chlorotrifluoroethylene), fluorinated ethylene/propylene copolymer, polystyrene-co-α-methyl styrene, ethylene/ethyl acetate copolymer, poly(styrene/butadiene), poly(styrene/2,4-dimethylstyrene), polypropylene-co-1-butene, poly(methyl methacrylate), poly(ethyl methacrylate), poly(2-hydroxyethyl methacrylate), poly(butyl methacrylate), poly(hexyl methacrylate), poly(benzyl methacrylate), poly(vinyl phenol), poly(vinyl alcohol), poly(vinyl alcohol-co-ethylene), poly(isobutylene/methyl methacrylate), poly(vinyl phenol/methyl methacrylate), poly(vinyl chloride), polysaccharides such as 2-hydroxyethyl cellulose, cellulose actate, cellullose acetate butyrate, ethyl cellulose; cyanated (ethoxylated) polysaccharides such as cyanopullulan (e.g., CYMM®), benzocyclobutene-based polymers, poly(2-vinylpyridine), poly(4-vinylpyridine), poly(4-vinylpyridine-co-butyl methacrylate), poly(4-vinylpyridine-co-styrene), poly(1-vinylpyrrolidone-co-styrene), poly(1-vinylpyrrolidone-co-vinyl acetate), poly(vinylidine fluoride), polyacrylonitrile, poly(acrylonitrile-co-butadiene-co-styrene), poly(acrylonitrile-co-methyl acrylate), polyacrylamide, poly(N-isopropylacrylamide), poly(2-ethyl-2-oxazoline), polyvinylpyrrolidone, poly(pentafluorostyrene), poly(dimethylsiloxane), poly(tetrahydrofuran), poly(methyl vinyl ether), poly(methyl vinyl ether-alt-maleic anhydride), poly(ethyl vinyl ether), poly(ethylene-alt-maleic anhydride), poly(allylamine), poly(ethyleneimine), poly(vinyl acetate), poly(vinyl cinnamate), poly(vinyl stearate), poly(vinyl propionate), poly(vinyl formate), poly(ethylene glycol), poly(propylene glycol), poly(styrene-co-acrylonitrile), poly(maleic anhydride-alt-1-octadecane), poly(tetrahydrofuryl methacrylate), poly(Bisphenol A carbonate), poly(propylene carbonate), poly(1,4-butylene terephthalate), poly(diallyl isophthalate), poly(hexafluoropropylene oxide), poly(fluoropropylene oxide-co-perfluoroformaldehyde), and combinations thereof. In addition, perfluoro(1-butenyl vinyl ether) homocyclopolymers (for example, those under the trade name CYTOP®) can be used. Examples of such fluorinated cyclopolymers include those having one of the following structures:

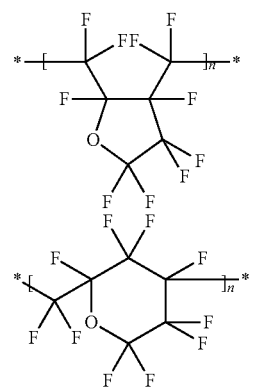

Poly[4,5-difluoro-2,2-bis(trifluoromethyl)-1,3-dioxole-co-tetrafluoroethylene (commercially available under the trade name Teflon® AF 2400) having the following structure also can be used:

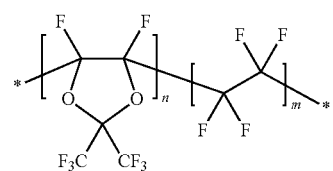

To retain the processing advantages of the present dendritic macromolecules, it is preferred that the one or more linear dielectric polymers also are soluble in a solvent which does not mobilize (i.e., dissolve, delaminate, swell, or otherwise physically disturb) or adversely affect the semiconducting properties of an underlying organic semiconductor material when the composition is deposited thereon to provide a dielectric material in contact with the semiconductor material. In embodiments where the dielectric composition includes either one or more linear dielectric polymers and/or one or more inorganic dielectric materials, the resulting dielectric material can be described as a blend dielectric material. As used herein, a compound can be considered soluble in a solvent when at least 1 mg of the compound can be dissolved in 1 mL of the solvent.

In some embodiments, the dielectric composition according to the present teachings can include a silane crosslinker having the formula:

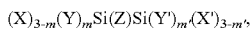

where Z can be selected from —O—, —(CH$_2$)$_n$—, —(CF$_2$)$_n$—, —(CH$_2$CH$_2$O)$_n$—, —(CF$_2$CF$_2$O)$_n$—, where n can be an integer from 1 to 20; X and X' independently can be selected from halide, dialkylamino, alkoxy and carboxylate groups, and combinations thereof; Y and Y' can be independently selected from H and alkyl; and m and m' can independently range from 0-2.

In some embodiments, the present dielectric composition can include an acrylate crosslinker, an epoxide crosslinker, and/or a thiol crosslinker Examples include the following:

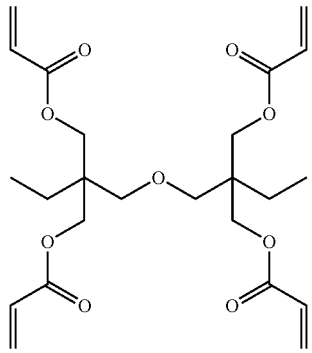

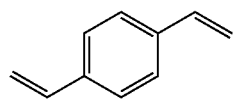

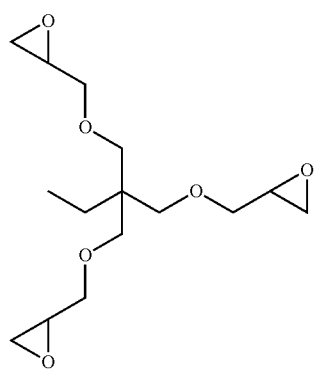

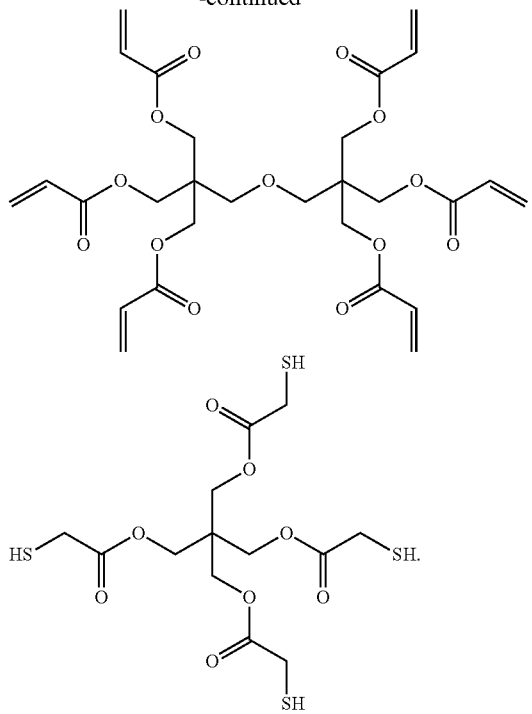

In embodiments where one or more crosslinkers are present in the dielectric composition or where the dendritic macromolecule in the dielectric composition include crosslinkable organic end groups, the dielectric material formed from the dielectric composition can be a crosslinked matrix with improved physical and/or electronic properties. For example, the crosslinked dielectric material can have an increased glass transition temperature (T$_g$), which can lead to enhanced thermal stability, smoother interface with an adjacent material (e.g., a semiconductor material), and/or reduced leakage current density.

In some embodiments, the composition can further include one or more additives independently selected from viscosity modulators, detergents, dispersants, binding agents, compatiblizing agents, curing agents, initiators, humectants, antifoaming agents, wetting agents, pH modifiers, biocides, and bactereriostats. For example, surfactants and/or polymers (e.g., polystyrene, polyethylene, poly-alpha-methylstyrene, polyisobutene, polypropylene, polymethylmethacrylate, and the like) can be included as a dispersant, a binding agent, a compatiblizing agent, and/or an antifoaming agent.

To prepare a dielectric material from a composition described herein, the composition can be deposited on a substrate via various deposition methods known in the art. For example, the substrate can be an electrically conductive material (e.g., a gate electrode in a transistor, an electrode in a capacitor) or a semiconductor material (the charge carrying layer in a transistor). In various embodiments, the dielectric composition is deposited on the substrate via a solution-phase process. In some embodiments, the depositing step can be carried out by printing, including inkjet printing and various contact printing techniques (e.g., screen-printing, gravure printing, offset printing, pad printing, lithographic printing, flexographic printing, and microcontact printing). In other embodiments, the depositing step can be carried out by spin coating, drop-casting, zone casting, dip coating, blade coating, or spraying. Spin-coating involves applying an excess amount of the coating solution onto a substrate, then rotating the substrate at high speed to spread the fluid by centrifugal force. The thickness of the resulting dielectric film prepared by this technique is dependent on the spin-coating rate, the concentration of the solution, as well as the solvent used. Printing can be performed, for example, with a rotogravure printing press, a flexo printing press, pad printing, screen printing or an inkjet printer. The thickness of the dielectric film as processed by these printing methods can be dependent on the concentration of the solution, the choice of solvent, and the number of printing repetitions. Ambient conditions such as temperature, pressure, and humidity, can also affect the resulting thickness of the film. Depending on the specific printing techniques used, printing quality can be affected by different parameters including, but not limited to, rheological properties of the formulations such as tension energy and viscosity.

Dielectric materials according to the present teachings can take various forms including a wafer, a layer, a sheet, or an elongated web. The present dielectric materials can be monolithic (e.g., composed of a single layer) or can have multiple sublayers (i.e., in the form of a multi-layer laminate), where the multiple sublayers can have identical or different chemical compositions. Multilayer dielectric materials according to the present teachings have two or more layers of dielectric materials sequentially deposited on top of each other (although one or more interlayers can be present), where at least one of the layers is prepared from a composition including a dendritic macromolecule according to the present teachings.

In some embodiments, the multi-layer laminate can include at least one layer prepared from a composition including the present dendritic macromolecules alone in a liquid medium, and at least one layer prepared from a linear dielectric polymer or an inorganic dielectric material. In embodiments where the dielectric material includes organic and inorganic sublayers, an interlayer can be present to improve adhesion between the sublayers.

In some embodiments, the multi-layer laminate can include at least one layer prepared from a composition including the present dendritic macromolecules in a liquid medium along with a metal oxide, a linear dielectric polymer, a silane crosslinker, and/or an acrylate crosslinker, and at least one layer prepared from a linear dielectric polymer or an inorganic dielectric material, or at least one layer prepared from a composition including the present dendritic macromolecules alone in a liquid medium.

Accordingly, in some embodiments, a dielectric material according to the present teachings can be prepared by dissolving one or more dendritic macromolecules described herein in an organic solvent to provide a dielectric composition, and depositing (e.g., by spin-coating or printing) the dielectric composition onto a substrate to form a dielectric material. In certain embodiments, one or more metal oxides can be added to the dielectric composition prior to the depositing step. In certain materials, one or more linear dielectric polymers can be added to the dielectric composition prior to the depositing step. In certain embodiments, one or more crosslinkers can be added to the dielectric composition prior to the depositing step.

In some embodiments, a multi-layer dielectric material according to the present teachings can be prepared by dissolving one or more dendritic macromolecules described herein in an organic solvent to provide a dielectric composition, where the dielectric composition optionally can include at least one of a linear dielectric polymer, a metal oxide, and a crosslinker; depositing (e.g., by spin-coating or printing) the dielectric composition onto a substrate to form a first layer; and depositing a composition that includes a linear dielectric polymer or a metal oxide to form a second layer. After each depositing step, a curing step can be performed, e.g., by heating, to accelerate removal of the solvent, and/or to induce photo or thermal crosslinking. With embodiments where the dendritic macromolecule is end-functionalized with a photo crosslinkable group, an irradiating step can be performed as described herein. With embodiments where the dendritic macromolecule is end-functionalized with a thermally crosslinkable group, heating steps carried out at different temperatures can be performed as described herein.

One of the advantages of the dendritic macromolecules and associated compositions disclosed herein is their ability to form a relatively high-k dielectric layer. In various embodiments, the present dendritic macromolecules can have a dielectric constant above about 2.5, preferably above about 3, wherein the dielectric constant can be determined using any procedures known in the art, including the procedures described in the standard test method ASTM D150. Dielectric materials of the present teachings can have large k values as measured from standard MIS and MIM capacitor structures measuring k versus voltage (V) and k versus frequency (f). For example, dielectric materials of the present teachings can have a dielectric constant k greater than about 2.5, a dielectric constant k greater than about 3, a dielectric constant k of about 4 or higher, or a dielectric constant k of about 5 or higher.

Without wishing to be bound by any particular theory, it is believed that the use of a relatively high-k (k>2.5) dielectric layer will increase the capacitance of the gate dielectric. This characteristic is important because in TFT applications, a higher dielectric constant allows a larger number of mobile carriers to be induced at lower voltages. Furthermore, if the dielectric constant of a dielectric material is large, a large capacitance can be obtained for thicker dielectric films, thus reducing the leakage current. Without wishing to be bound by any other particular theory, the dielectric compositions disclosed herein, due to the end group functionalization of the dendritic macromolecules, have solubility properties that are favorable to device fabrication using solution-phase processes. The end groups also reduce the force between the mobile charge in the semiconductor and the dipole (polarization) of the high-k dendritic core. This can lead to higher mobilities in a transistor device.

Dendritic macromolecules of the present teachings can have tuned glass transition temperature ($T_g$). In various embodiments, the present dendritic macromolecules can have a $T_g$ between about −40° C. and about 200° C. Higher $T_g$ can be obtained with end group functionalization that includes rigid cyclic groups, for example, caged hydrocarbons such as adamantine, or by post-deposition crosslinking of crosslinkable end groups.

Accordingly, compositions (formulations) including one or more dendritic macromolecules of the present teachings can be used to prepare single- or multi-layer dielectric materials that can exhibit a wide range of desirable properties and characteristics including, but not limited to, high dielectric constant, low leakage current densities, high breakdown voltages, low hysteresis, tuned capacitance values, uniform film thickness, solution-processability, fabricability at low temperatures and/or atmospheric pressures, air and moisture stability, and/or compatibility with diverse gate materials and/or semiconductors.

Leakage current density typically is defined as a vector whose magnitude is the leakage current per cross-sectional area. As used herein, "leakage current" refers to uncontrolled ("parasitic") current flowing across region(s) of a semiconductor structure or device in which no current should be flowing, for example, current flowing across the gate dielectric in a thin-film transistor device. As known by those skilled in the art, the leakage current density of a dielectric material can be determined by fabricating a standard metal-insulator-semiconductor (MIS) and/or metal-insulator-metal (MIM) capacitor structures with the dielectric material, then measuring the leakage current, and dividing the measured current by the area of the metal electrodes.

Dielectric materials that incorporate one or more dendritic macromolecules of the present teachings can have very low leakage current densities as measured from standard MIS and MIM capacitor structures. For example, dielectric materials according to the present teachings can have a leakage current density of less than or equal to about $1 \times 10^{-6}$ A/cm² at E=2 MV/cm, less than or equal to about $1 \times 10^{-7}$ A/cm² at E=2 MV/cm, less than or equal to about $1 \times 10^{-8}$ A/cm² at E=2 MV/cm, less than or equal to about $8 \times 10^{-9}$ A/cm² at E=2 MV/cm, less than or equal to about $7 \times 10^{-9}$ A/cm² at E=2 MV/cm, less than or equal to about $6 \times 10^{-9}$ A/cm² at E=2 MV/cm, less than or equal to about $4 \times 10^{-9}$ A/cm² at E=2 MV/cm, less than or equal to about $2 \times 10^{-9}$ A/cm² at E=2 MV/cm, or less than or equal to about $1 \times 10^{-9}$ A/cm² at E=2 MV/cm.

Dielectric materials prepared from dendritic macromolecules of the present teachings also can withstand very high breakdown voltages (i.e., the maximum voltage difference that can be applied across the dielectric before it breaks down and begins to conduct). For example, dielectric materials of the present teachings can withstand a breakdown voltage of 4 MV/cm or higher, a breakdown voltage of 6 MV/cm or higher, or a breakdown voltage of 7 MV/cm or higher.

The present teachings further provide articles of manufacture, for example, composites, that includes a dielectric material of the present teachings. For example, the articles of manufacture can be an electronic, optical, or optoelectronic device that includes a semiconductor component, where the dielectric material of the present teachings is in contact with the semiconductor component. The semiconductor component can be selected from, but is not limited to, various fused heterocycles, aromatic hydrocarbons, polythiophenes, fused (hetero)aromatics (e.g., perylene imide and naphthalene imide small molecule or polymers), and other such organic semiconductor compounds or materials, whether p-type or n-type, otherwise known or found useful in the art. For example, the semiconductor component can be prepared from one or more compounds and/or polymers as described in U.S. Pat. Nos. 6,585,914, 6,608,323, 6,991,749, 7,374702, 7,528, 176, 7,569,693, and 7,605,225; U.S. Patent Publication Nos. 2005/0176970, 2006/0186401, 2007/0282094, 2008/0021220, 2008/0167435, 2008/0177073, 2008/0185555, 2008/0185577, 2008/0249309, and 2009/0036643; and International Publication Nos. WO2009/098254, WO2009/098252, WO2009/098253, and WO2009/098250, the disclosure of each of which is incorporated by reference herein. The semiconductor component also can include inorganic semiconductor materials such as silicon, germanium, gallium arsenide, metal oxides, and the like.

In some embodiments, the articles of manufacture can an electronic, optical, or optoelectronic device that includes an electrically conductive material. An example is a capacitor, where the dielectric material is disposed between two electrically conductive layers. Another example is a transistor, where one side of the dielectric material is in contact with a semiconductor component and an opposite side of the dielectric material is in contact with an electrically conductive material (the gate electrode).

The articles of manufacture can include a substrate. The substrate can be composed of a material selected from, for example, doped silicon, an indium tin oxide (ITO), ITO-coated glass, ITO-coated polyimide or other plastics, aluminum or other metals alone or coated on a polymer or other substrate, a doped polythiophene, and the like.

In embodiments where the article of manufacture is a transistor device (such as organic thin film transistors (OTFTs), specifically, organic field effect transistors (OFETs) and organic light-emitting transistors (OLETs), the transistor device also includes a source electrode and a drain electrode. The source and drain electrodes can be made using various deposition techniques. The source and drain electrodes can be deposited through a mask, or can be deposited then etched. Suitable deposition techniques include electrodeposition, vaporization, sputtering, electroplating, coating, laser ablation and offset printing, from metal or metal alloy including copper, aluminum, gold, silver, platinum, palladium, and/or nickel, or an electrically conductive polymer such as polyethylenethioxythiophene ("PEDOT").

An aspect of the present teachings relates to a thin film transistor device including a dielectric layer comprising a dielectric material as described herein, a semiconductor layer, a gate electrode, a source electrode, and a drain electrode. The dielectric layer typically is disposed between the semiconductor layer and the gate electrode. Depending on the device geometry, the source and drain electrodes can be disposed above the semiconductor layer (top-contact), or the semiconductor layer can be disposed above the source and drain electrodes (bottom-contact).

Figure 9:
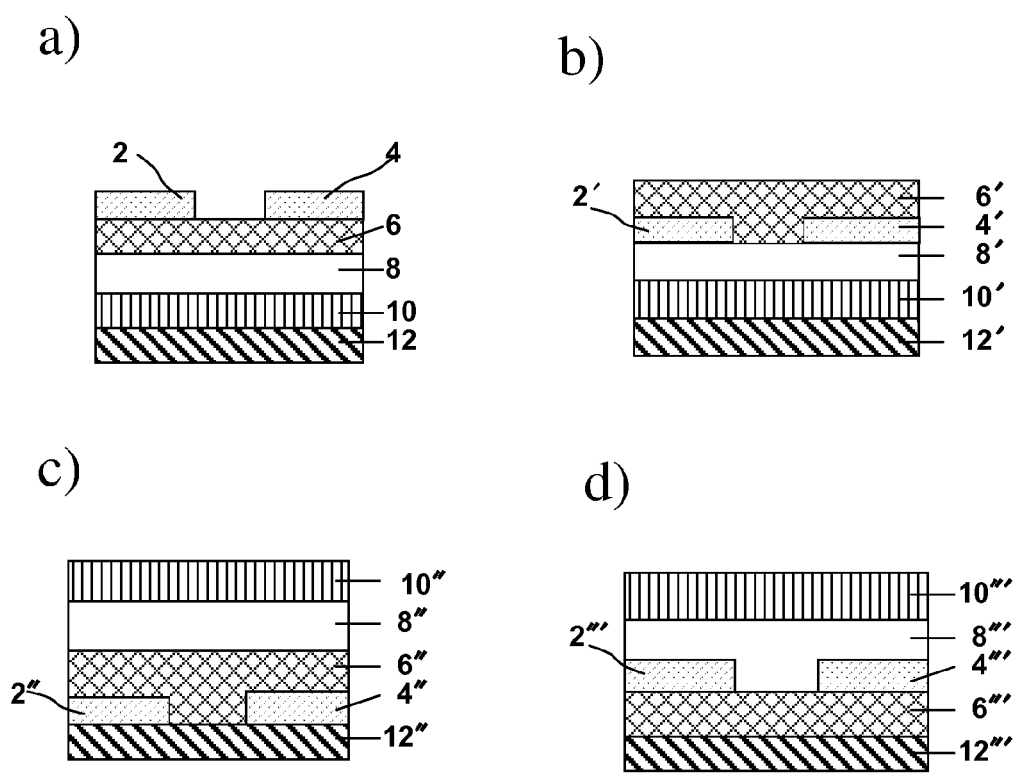
FIG. 9 illustrates four different configurations of thin film transistors: a) bottom-gate top contact, b) bottom-gate bottom-contact, c) top-gate bottom-contact, and d) top-gate top-contact; each of which can be used to incorporate one or more dendritic macromolecules of the present teachings, particularly as the dielectric layer or part of the dielectric component.

Another aspect of the present teachings relates to methods for fabricating organic field effect transistors that include a dielectric material of the present teachings. The dielectric materials of the present teachings can be used to fabricate various types of organic field effect transistors including, but not limited to, top-gate top-contact structures, top-gate bottom-contact structures, bottom-gate top-contact structures, and bottom-gate bottom-contact structures. FIG. 9 illustrates the four common types of OFET structures: (a) bottom-gate top-contact structure, (b) bottom-gate bottom-contact structure, (c) top-gate bottom-contact structure, and (d) top-gate top-contact structure. As shown in FIG. 9, an OFET can include a dielectric layer (e.g., shown as 8, 8', 8", and 8''' in FIGS. 9a, 9b, 9c, and 9d, respectively), a semiconductor/channel layer (e.g., shown as 6, 6', 6", and 6''' in FIGS. 9a, 9b, 9c, and 9d, respectively), a gate contact (e.g., shown as 10, 10', 10", and 10''' in FIGS. 9a, 9b, 9c, and 9d, respectively), a substrate (e.g., shown as 12, 12', 12", and 12''' in FIGS. 9a, 9b, 9c, and 9d, respectively), and source and drain contacts (e.g., shown as 2, 2', 2", 2''', 4, 4', 4", and 4''' in FIGS. 9a, 9b, 9c, and 9d, respectively).

In some embodiments, the method can include depositing a dielectric composition according to the present teachings onto a substrate (gate) to form a dielectric layer, wherein the dielectric composition includes one or more dendritic macromolecules described herein dissolved in a first solvent; depositing a semiconducting composition onto the dielectric layer to form a semiconductor layer, where the semiconducting composition includes one or more semiconducting compounds (e.g., small molecule compounds or polymers) dissolved in a second solvent, and where the first solvent and the second solvent are orthogonal solvents; and forming a first electrical contact and a second electrical contact (source and drain) on the semiconductor layer, thereby providing a top-contact bottom-gate organic field effect transistor. The method can include curing the dielectric layer, for example, by heating and/or exposure to radiation to induce crosslinking.

In some embodiments, the method can include depositing a dielectric composition according to the present teachings onto a substrate (gate) to form a dielectric layer, wherein the dielectric composition includes one or more dendritic macromolecules described herein dissolved in a first solvent; forming a first electrical contact and a second electrical contact (source and drain) above the dielectric material, and depositing a semiconducting composition above the first and second electrical contacts and the dielectric layer (i.e., to cover the electrical contacts and an area of the dielectric material between the electrical contacts) to form a semiconductor layer, where the semiconducting composition includes one or more semiconducting compounds (e.g., small molecule compounds or polymers) dissolved in a second solvent, and where the first solvent and the second solvent are orthogonal solvents; to provide a bottom-contact bottom-gate organic field effect transistor. The method can include curing the dielectric layer, for example, by heating and/or exposure to radiation to induce crosslinking.

In some embodiments, the method can include forming a first electrical contact and a second electrical contact (source and drain) on a substrate, depositing a semiconducting composition above the first and second electrical contacts (i.e., to cover the electrical contacts and an area of the substrate between the electrical contacts) to form a semiconductor layer, where the semiconducting composition includes one or more semiconducting compounds (e.g., small molecule compounds or polymers) dissolved in a first solvent; depositing a dielectric composition according to the present teachings above the semiconductor layer to form a dielectric layer, where the dielectric composition includes one or more dendritic macromolecules described herein dissolved in a second solvent, and where the first solvent and the second solvent are orthogonal solvents; and forming a third electrical contact (gate) above the dielectric material, wherein the third electrical contact is above an area between the first and second electrical contacts, to provide a bottom-contact top-gate organic field effect transistor. The method can include curing the dielectric layer, for example, by heating and/or exposure to radiation to induce crosslinking.

In some embodiments, the method can include depositing a semiconducting composition on a substrate to form a semiconductor layer, where the semiconducting composition includes one or more semiconducting compounds (e.g., small molecule compounds or polymers) dissolved in a first solvent; forming a first electrical contact and a second electrical contact (source and drain) above the semiconductor layer; depositing a dielectric composition according to the present teachings above the first and second electrical contacts and an area of the semiconductor layer between the first and second electrical contacts to form a dielectric layer, where the dielectric composition includes one or more dendritic macromolecules described herein dissolved in a second solvent, and where the first solvent and the second solvent are orthogonal solvents; and forming a third electrical contact (gate) above the dielectric material, wherein the third electrical contact is above an area between the first and second electrical contacts, to provide a top-contact top-gate organic field effect transistor. The method can include curing the dielectric layer, for example, by heating and/or exposure to radiation to induce crosslinking.

The semiconductor layer and the various electrical contacts can be formed by various deposition processes known to those skilled in the art. For example, the semiconductor layer can be formed by processes such as, but not limited to, physical vapor deposition, different types of printing techniques (e.g., flexo printing, litho printing, gravure printing, ink-jetting, pad printing, and so forth), drop casting, dip coating, doctor blading, roll coating, and spin-coating. Electrical contacts can be formed by processes such as, but not limited to, thermal evaporation and radiofrequency or e-beam sputtering, as well as various deposition processes, including but not limited to those described immediately above (e.g., flexo printing, litho printing, gravure printing, ink-jetting, pad printing, screen printing, drop casting, dip coating, doctor blading, roll coating, and spin-coating).

In the following examples, dendritic macromolecules and dielectric materials according to the present teachings were prepared and characterized by NMR, differential scanning calorimetry (DSC), AFM, and metal-insulator-semiconductor (MIS) device leakage and impedance spectroscopy measurements, to demonstrate, among other things, their dielectric properties and their compatibility with various p-type and n-type organic semiconductors. Organic electronic devices, for example, organic thin film transistors (OTFTs), specifically, organic field effect transistors (OFETs), based on these dielectric films also have been fabricated and characterized, data of which are provided below.

The following examples are provided to illustrate further and to facilitate the understanding of the present teachings and are not in any way intended to limit the invention.

Example 1

Synthesis of D1

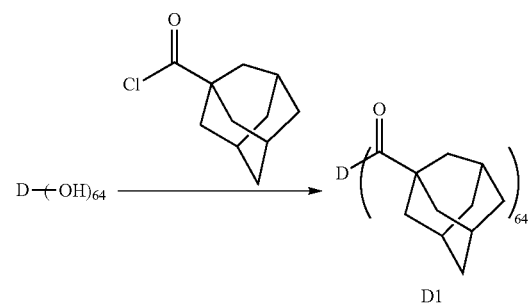

To a solution of hyperbranched bis-MPA polyester-64-hydroxyl, generation 4 ("D-(OH)$_{64}$", average molecular weight 7323, from Sigma-Aldrich) (2.0 g, 0.27 mmol) and 10 mg of 4-dimethylaminopyridine in 8 mL of pyridine was added a solution of 8.0 g (40.3 mmol) of adamantoyl chloride in 10 mL of methylene chloride. The mixture was stirred at ambient temperature for 3 hours then treated with 1 mL of acetic anhydride. The mixture was stirred at ambient temperature for 1 hour then treated with 3 mL of water. The mixture was stirred for 5 minutes then treated with 100 mL of methanol. The supernatant was decanted and the remaining residue was precipitated twice more from methylene chloride (15 mL)/methanol (75 mL), each time decanting the supernatant. The remaining residue was concentrated under vacuum to give 4.5 g (93% yield) of a colorless foam. $^1$H NMR (CDCl$_3$, 500 MHz): δ 4.35-4.11 (m), 3.72-3.41 (m), 2.10-1.20 (m). GPC (chloroform, polystyrene standard) $M_N$=7.7 k, PDI=1.7. DSC (10° C. min$^{-1}$) $T_g$=75° C.

Example 2

Synthesis of D2

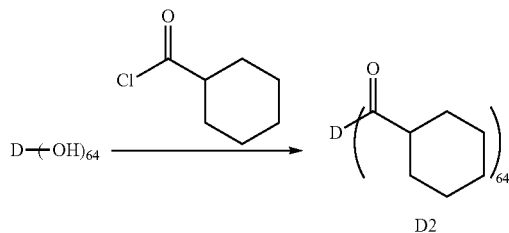

D2

To a solution of 6.0 g (0.82 mmol) of D-(OH)$_{64}$ and 10 mg of 4-dimethylaminopyridine in 40 mL of pyridine was added 16 mL g (120 mmol) of cyclohexanecarbonyl chloride. The mixture was stirred at ambient temperature for 1 hour then treated with 3 mL of water. The mixture was cooled to room temperature and poured into 150 mL of methanol. The supernatant was decanted and the remaining residue was precipitated from methylene chloride (20 mL)/methanol (100 mL). The remaining residue was washed with methanol (3×10 mL) and concentrated under vacuum to give 9.2 g (78% yield) of a colorless foam. $^1$H NMR (CDCl$_3$, 500 MHz): δ 4.35-4.11 (m), 3.72-3.41 (m), 2.30-1.00 (m). GPC (chloroform, polystyrene standard) $M_N$=8.5 k, PDI=1.7.

Example 3

Synthesis of D3

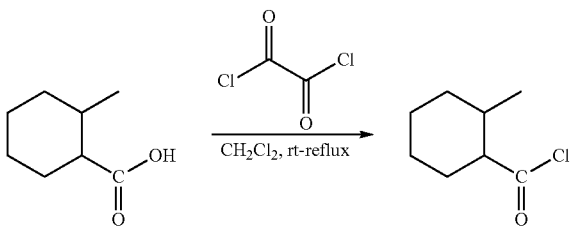

A mixture of 4.7 g (33.1 mmol) of 2-methylcyclohexyl carboxylic acid (Aldrich, mixture of cis and trans), 10 mL of oxalyl chloride, and dry dichloromethane (70 mL) was stirred at room temperature under nitrogen for 30 minutes then refluxed for 3 hours. The mixture was concentrated in vacuo to give a colorless oil (5.2 g, 98%). $^1$H NMR (CDCl$_3$, 500 MHz): δ 2.97 (m, 1H), 2.37 (m, 1H), 1.85 (m, 1H), 1.80-1.70 (m, 2H), 1.70-1.60 (m, 2H), 1.60-1.46 (m, 2H), 1.45-1.25 (m, 2H), 1.00 (d, 3H, J=7.0).

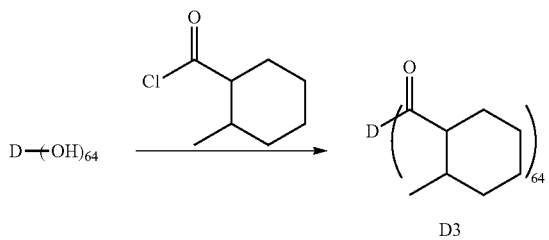

D3

Under nitrogen, D-(OH)$_{64}$ (0.59 g, 0.081 mmol) and DMAP (15.1 mg) were dissolved in dry pyridine (1.5 mL). A solution of 2-methylcyclohexyl carbonyl chloride (1.69 g, 10.5 mmol) in dry DCM (6 mL) was added slowly. The reaction mixture was allowed to stir at room temperature under nitrogen for 15 hours. Acetic anhydride (1 mL) was then added, and the mixture was stirred for additional 2 hours, before it was precipitated in methanol. The isolated solid product was washed twice with ammonia aqueous solution, and washed with methanol, leading to a white solid as the product (450 mg).

Example 4

Synthesis of D4

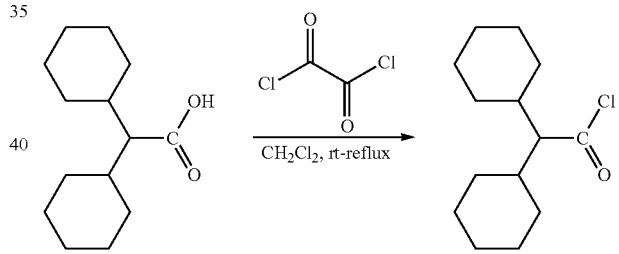

A mixture of 5.0 g (22.3 mmol) of dicyclohexyl acetic acid, 6.4 mL of oxalyl chloride, and 100 mL of dry dichloromethane was stirred at room temperature under nitrogen for 20 minutes, then refluxed for 1 hour. The mixture was concentrated in vacuo to give a colorless oil (4.9 g, 90%). $^1$H NMR (CDCl$_3$ 500 MHz): δ: 2.70 (t, 1H, J=7.5), 1.76 (m, 10H), 1.67 (m, 2H), 1.30-1.03 (m, 10H).

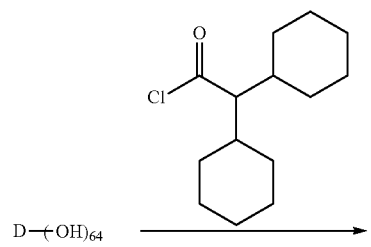

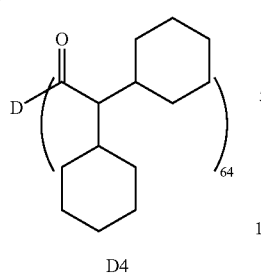

D4

Under nitrogen, D-(OH)$_{64}$ (0.60 g, 0.082 mmol) and DMAP (15.2 mg) were dissolved in dry pyridine (1.5 mL). A solution of dicyclohexyl acetyl chloride (2.55 g, 10.5 mmol) in dry dichloromethane (DCM) (6 mL) was added slowly. The reaction mixture was allowed to stir at room temperature under nitrogen for 14 hours. Acetic anhydride (1 mL) was then added, and the mixture was stirred for additional 2 hours, before it was precipitated in methanol. The isolated solid product was washed twice with ammonia aqueous solution, then dissolved in DCM, and passed through a syringe filter. The filtrate was precipitated in methanol twice, leading to a white solid as the product. $^1$H NMR (CDCl$_3$, 500 MHz): δ: 4.40-4.04 (m), 3.70-3.42 (m), 2.06 (s, br), 1.78-1.50 (m), 1.42-0.85 (m), 0.85 (m). GPC (chloroform, polystyrene standard) M$_N$=8.3 k, PDI=1.7. DSC (10° C. min$^{-1}$) T$_g$=45° C.

Example 5

Synthesis of D5

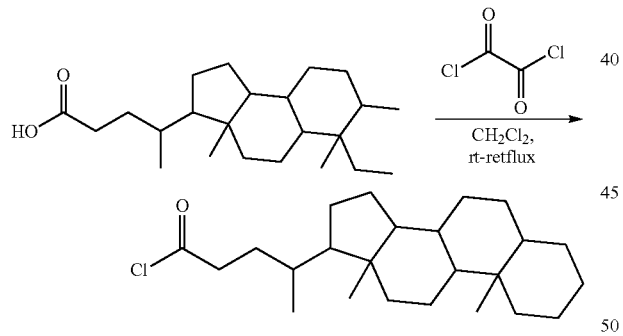

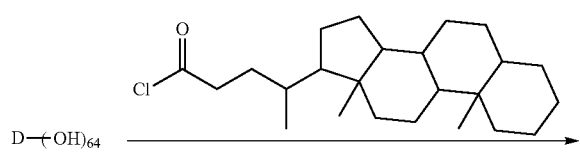

A mixture of 0.5 g (1.39 mmol) of 5β-cholanic acid (Aldrich), 0.4 mL (4.6 mmol) of oxalyl chloride, and 10 mL of methylene chloride was heated in a sealed reaction vessel at 60° C. for 15 minutes. The volatiles were distilled off to give 5β-cholanoyl chloride as a colorless solid in quantitative yield. m.p. 104-106° C. $^1$H NMR (CDCl$_3$, 500 MHz): δ 2.94 (m, 1H), 2.83 (m, 1H), 2.00-0.67 (m, 37H).

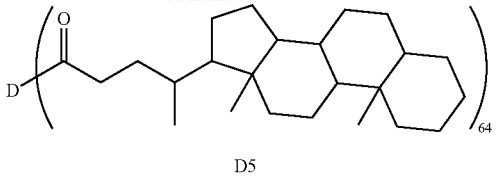

D5

To a solution of 0.1 g (0.014 mmol) of D-(OH)$_{64}$ and 5 mg of 4-dimethylaminopyridine in 0.25 mL of pyridine was added a solution of 0.5 g (1.32 mmol) 5β-cholanoyl chloride in 1 mL of methylene chloride. The mixture was stirred at ambient temperature for 90 minutes then treated with 0.5 mL of acetic anhydride. The mixture was stirred at ambient temperature for 30 minutes, then treated with 1 mL of water. The mixture was stirred for 2 minutes, then treated with 20 mL of methanol. The supernatant was decanted and the remaining residue was precipitated twice more from methylene chloride (1 mL)/methanol (10 mL), each time decanting the supernatant. The remaining residue was concentrated under vacuum to give 0.25 g (63% yield) of a colorless foam. $^1$H NMR (CDCl$_3$, 500 MHz): δ 4.35-4.11 (m), 3.70-3.40 (m), 2.50-0.66 (m). GPC (chloroform, polystyrene standard) M$_N$=11.3 k, PDI=1.5.

Example 6

Synthesis of D6

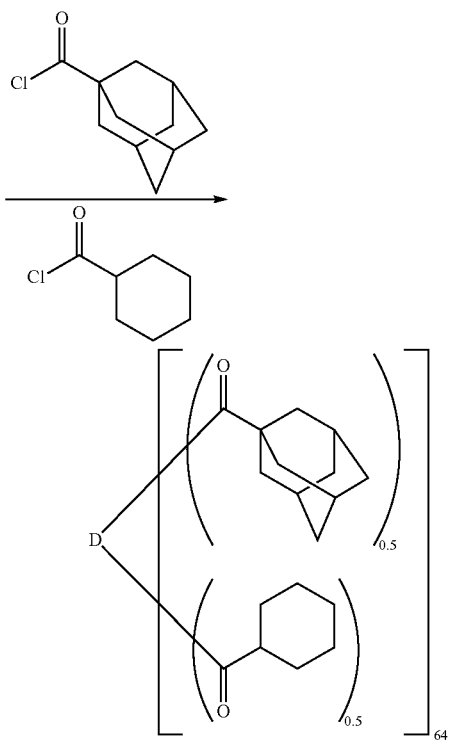

D7

To a solution of 1.0 g (0.137 mmol) of D-(OH)$_{64}$ and 5 mg of 4-dimethylaminopyridine in 3 mL of pyridine was added a solution of 0.87 g (4.38 mmol) adamantoyl chloride in 2 mL of methylene chloride. The mixture was stirred at ambient temperature for 1 hour then treated with 2.0 mL (15 mmol) of cyclohexanecarbonyl chloride. The mixture was stirred at ambient temperature for 23 hours then treated with 0.5 mL of acetic anhydride. The mixture was stirred at ambient temperature for 1 hour, then treated with 2 mL of water. The mixture was stirred for 2 minutes, then treated with 50 mL of methanol. The supernatant was decanted and the remaining residue was precipitated twice more from methylene chloride (5 mL)/methanol (50 mL), each time decanting the supernatant. The remaining residue was concentrated under vacuum to give 1.9 g (86% yield) of a colorless foam. $^1$H NMR (CDCl$_3$, 500 MHz): δ 4.35-4.11 (m), 3.72-3.41 (m), 2.35-1.00 (m).

Example 7

Synthesis of D7

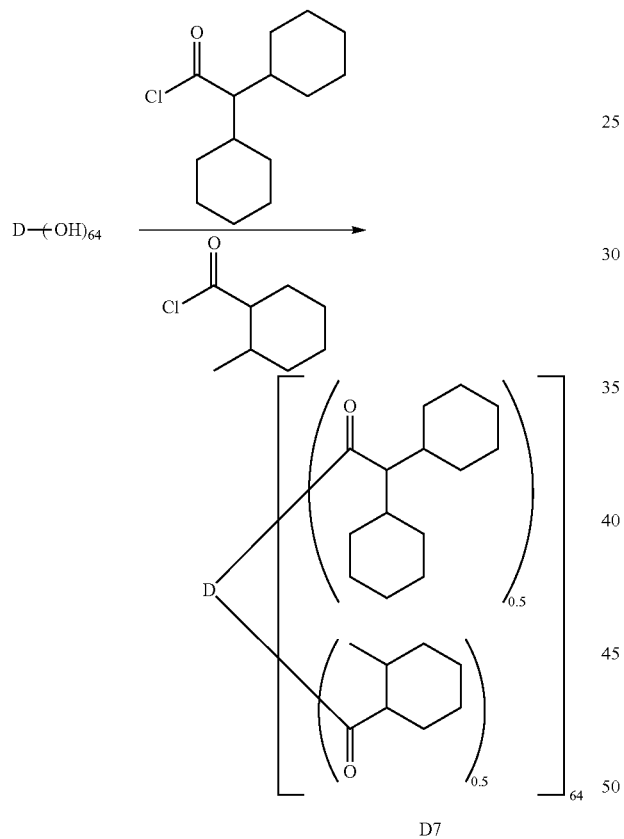

D7

Under nitrogen, D-(OH)$_{64}$ (0.59 g, 0.081 mmol) and DMAP (15.0 mg) were dissolved in dry pyridine (1.5 mL). A solution of dicyclohexyl acetyl chloride (0.65 g, 2.68 mmol) in dry DCM (2 mL) was added slowly, and the resulting mixture was stirred at room temperature for 3 hours. A solution of 2-methylhexyl carbonyl chloride (1.27 g, 7.91 mmol) in dry DCM (4 mL) was added slowly. The reaction mixture was allowed to stir at room temperature under nitrogen for additional 14 hours. Acetic anhydride (1 mL) was then added, and the mixture was stirred for additional 2 hours, before it was precipitated in methanol. The isolated solid product was washed twice with ammonia aqueous solution, and it was then dissolved in DCM, passed through a syringe filter. The filtrate was precipitated in methanol twice, leading to a white solid as the product. $^1$H NMR (CDCl$_3$, 500 MHz): δ: 4.02-4.50 (m, br), 3.40-3.80 (m, br), 2.36 (s, br), 2.06 (m, br), 1.40-1.78 (m, br), 0.90-1.40 (m, br), 0.87 (s, br).

Example 8

Synthesis of D8

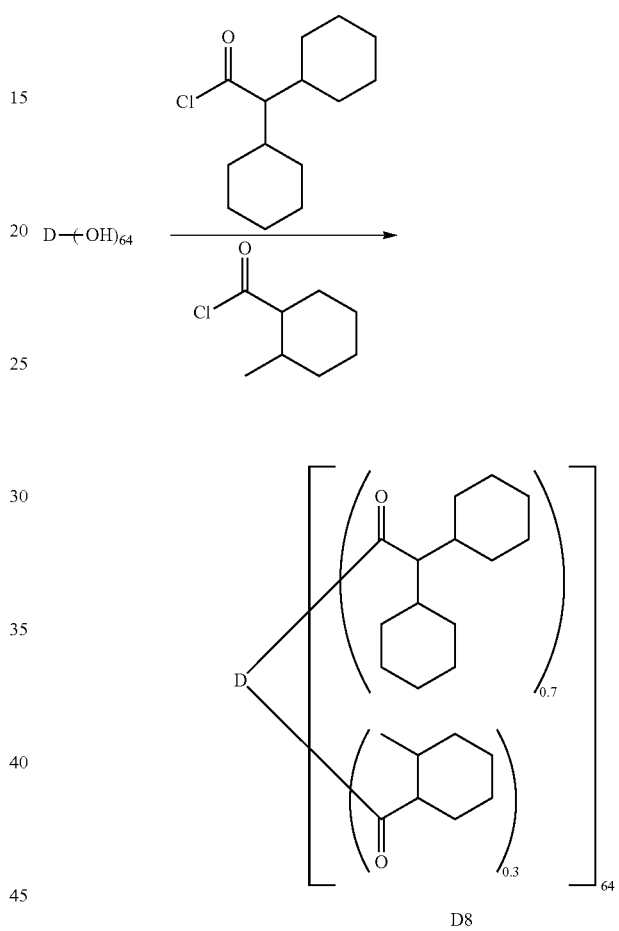

D8

Under nitrogen, D-(OH)$_{64}$ (0.34 g, 0.046 mmol) and 4-dimethylaminopyridine (8.9 mg) were dissolved in dry pyridine (0.9 mL). A solution of 2-methylhexyl carbonyl chloride (0.13 g, 0.81 mmol) in dry DCM (1.5 mL) was added slowly, and the resulting mixture was stirred at room temperature for 3 hours. A solution of dicyclohexyl acetyl chloride (1.25 g, 5.15 mmol) in dry DCM (3.5 mL) was added slowly. The reaction mixture was allowed to stir at room temperature under nitrogen for additional 18 hours. Acetic anhydride (0.7 mL) was then added, and the mixture was stirred for additional 2 hours, before it was precipitated in methanol. The isolated solid product was washed twice with ammonia aqueous solution, then dissolved in DCM, and passed through a syringe filter. The filtrate was precipitated in methanol twice, leading to a white solid as the product. $^1$H NMR (CDCl$_3$, 500 MHz): δ: 4.08-4.38 (m, br), 3.35-3.72 (m, br), 2.50 (s, br), 2.06 (m, br), 1.48-1.53 (m, br), 0.90-1.31 (m, br), 0.87 (m, br). DSC (10° C. min$^{-1}$) T$_g$=40° C.

Example 9

Synthesis of D9

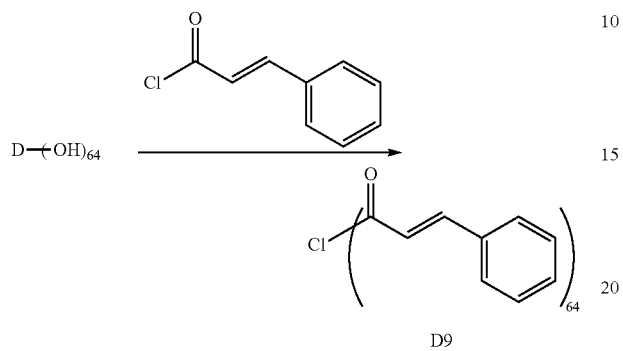

D9

To a solution of 1.0 g (0.137 mmol) of D-(OH)$_{64}$ and 10 mg of 4-dimethylaminopyridine in 3 mL of pyridine was added a solution of 3.5 g (21 mmol) of cinnamoyl chloride in 5 mL of tetrahydrofuran. The mixture was stirred at ambient temperature for 1 hour then treated with 0.3 mL of acetic anhydride and 2 mL of methylene chloride. The mixture was stirred at ambient temperature for 5 minutes, then treated with 2 mL of water. The mixture was stirred for 2 minutes, then treated with 50 mL of methanol. The supernatant was decanted and the remaining residue was precipitated twice more from methylene chloride (5 mL)/methanol (50 mL), each time decanting the supernatant. The remaining residue was concentrated under vacuum to give 2.0 g (93% yield) of a colorless foam. GPC (chloroform, polystyrene standard) M$_N$=7.4 k, PDI=1.6.

Example 10

Synthesis of D10

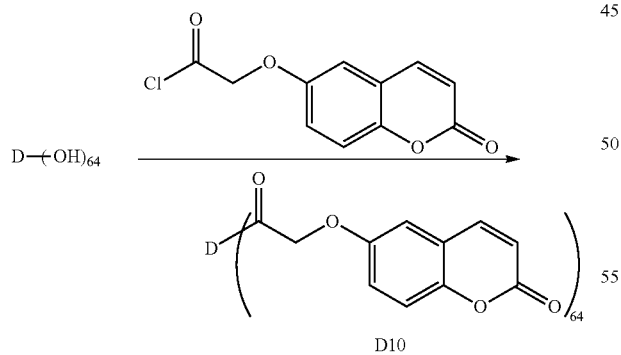

D10

To a solution of 0.2 g (0.027 mmol) of D-(OH)$_{64}$ and 5 mg of 4-dimethylaminopyridine in 2 mL of pyridine was added a warm solution of 0.65 g (2.7 mmol) of coumarin acid chloride in 5 mL of 1,4-dioxane. The mixture was stirred at ambient temperature for 20 minutes then the supernatant was decanted. The remaining residue was treated with 25 mL of methanol and stirred for 1 hour. The solid was filtered off and dried in air. The material was dissolved in 3 mL of cyclopentanone and added to 30 mL of methanol. The mixture was stirred for 30 minutes and filtered. The filter cake was dried under vacuum to give 0.42 g (77% yield) of a tan powder.

Example 11

Synthesis of D11

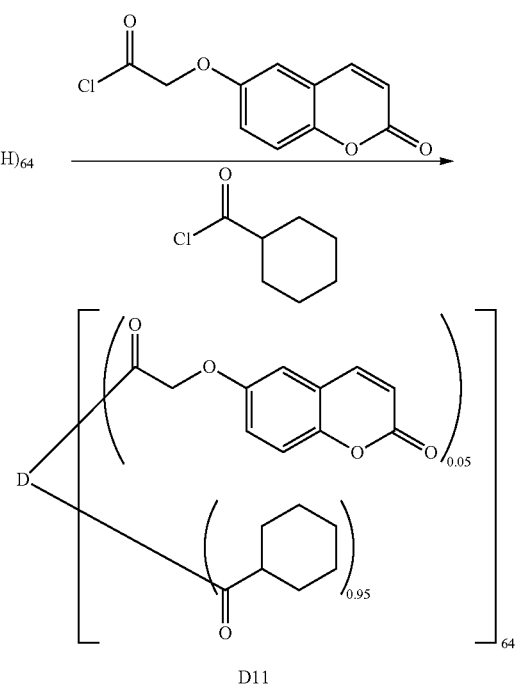

D11

To a solution of 0.90 g (0.123 mmol) of D-(OH)$_{64}$ and 5 mg of 4-dimethylaminopyridine in 5 mL of pyridine was added a warm solution of 0.090 g (0.377 mmol) of coumarin acid chloride in 1 mL of 1,4-dioxane. The mixture was stirred at ambient temperature for 10 minutes, then treated with 2.3 mL (17 mmol) of cyclohexanecarbonyl chloride. The mixture was stirred at ambient temperature for 30 minutes, then treated with 1 mL of water. The mixture was stirred for 5 minutes, then poured into 100 mL of methanol. The supernatant was decanted and the remaining residue was dissolved in 10 mL of methylene chloride. The solution was added to 50 mL of methanol and the supernatant was decanted. The remaining residue was rinsed with methanol (3×5 mL) and concentrated under vacuum to give 1.1 g (61% yield) of a colorless foam.

Example 12

Synthesis of D12

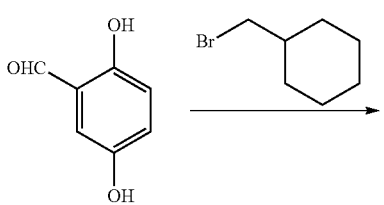

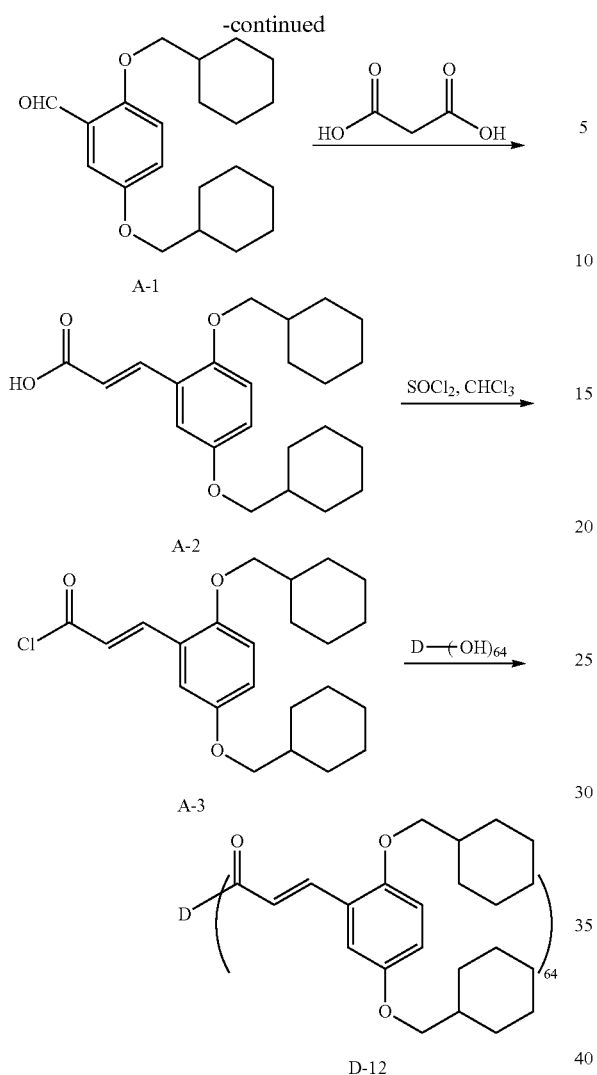

s, 1H), 8.12 (d, 1H, J=16.1), 7.08 (d, 1H, J=3.0), 6.92 (dd, 1H, J=9.0, 3.0), 6.85 (d, 1H, J=9.0), 6.54 (d, 1H, J=16.1), 3.79 (d, 2H, J=6.0), 3.74 (d, 2H, J=6.42), 1.95-1.00 (m, 22H).

To a solution of 0.84 g (2.26 mmol) of A-2 in 10 mL of chloroform was added 1.0 mL (13.7 mmol) of $SOCl_2$. The mixture was heated in an oil bath at 60° C. for 15 minutes. The mixture was concentrated in vacuo and co-evaporated twice from 5 mL of chloroform to give 0.86 g (98% yield) of compound A-3 as a yellow solid. m.p. 74-76° C. $^1$H NMR ($CDCl_3$, 500 MHz): δ 8.50 (d, 1H, J=15.6), 7.02 (d, 1H, J=3.0), 6.99 (dd, 1H, J=9.0, 3.0), 6.87 (d, 1H, J=9.0), 6.78 (d, 1H, J=15.6), 3.82 (d, 2H, J=5.6), 3.74 (d, 2H, J=6.4), 1.95-1.00 (m, 22H).

To a solution of 0.2 g (0.027 mmol) of D-$(OH)_{64}$ and 5 mg of 4-dimethylaminopyridine in 0.5 mL of pyridine was added a solution of 0.77 g (1.97 mmol) of compound A-3 in 1.5 mL of chloroform. The mixture was stirred at ambient temperature for 1 hour, then treated with 0.25 mL (1.84 mmol) of cyclohexylcarbonyl chloride. The mixture was stirred for 15 minutes, then treated with 0.2 mL of acetic anhydride. The mixture was stirred at ambient temperature for 1 minutes, then treated with 3 mL of water. The mixture was stirred for 5 minutes, then treated with 50 mL of methanol. The supernatant was decanted and the remaining residue was precipitated twice more from methylene chloride (2 mL) and pyridine (0.1 mL)/methanol (35 mL), each time decanting the supernatant. The remaining residue was concentrated under vacuum and coevaporated twice from 25 mL of cyclohexane to give 0.49 g (60% yield) of a colorless foam. $^1$H NMR ($CDCl_3$, 500 MHz): δ 8.1-7.8 (m), 7.1-6.3 (m), 4.45-4.1 (m), 3.75-3.4 (m), 1.95-0.95 (m). GPC (chloroform, polystyrene standard) $M_N$=11.6 k, PDI=18.5.

Example 13

Synthesis of D13

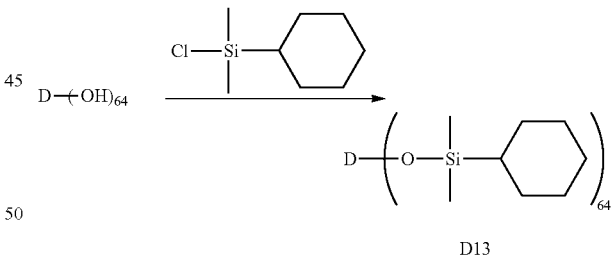

To a solution of 1.0 g (0.137 mmol) of D-$(OH)_{64}$, 2.4 g (35.3 mmol) of imidazole, and 50 mg (0.41 mmol) of 4-dimethylaminopyridine in 5 mL of DMF was added 2.3 g (13.0 mmol) of chlorocyclohexyldimethylsilane (Aldrich). The mixture was stirred at ambient temperature for 17 hours then treated with 1 mL of acetic anhydride. The mixture was stirred at ambient temperature for 15 minutes then treated with 50 mL of saturated aqueous ammonium chloride. The mixture was extracted with 100 mL of diethyl ether. The separated ethereal layer was washed with 50 mL of brine, dried over $MgSO_4$, filtered, and concentrated in vacuo. The resulting oil was stirred with 10 mL of methanol for 15 minutes and the methanol was decanted. The resulting material was co-evaporated from 15 mL of cyclohexane to give the A mixture of 5.0 g (36.2 mmol) of 2,5-dihydroxybenzaldehyde (Alfa Aesar), 13.5 g (76.2 mmol) of cyclohexylmethyl bromide, 12.5 g (90.4 mmol) of $K_2CO_3$, and 50 mL of DMF was heated in an oil bath at 100° C. for 14 hours. The mixture was concentrated in vacuo then treated with 100 mL of toluene. The suspension was filtered and the filter cake rinsed with 3×50 mL of toluene. The filtrate was concentrated in vacuo and purified by flash chromatography ($SiO_2$, 5.5×30 cm, toluene) to give 6.40 g (54% yield) of compound A-1 as a tan solid. $^1$H NMR ($CDCl_3$, 500 MHz): δ 10.51 (s, 1H), 7.32 (d, 1H, J=3.2), 7.13 (dd, 1H, J=9.0, 3.2), 6.93 (d, 1H, J=9.0), 3.84 (d, 2H, J=5.9), 3.76 (d, 2H, J=6.4), 1.95-1.00 (m, 22H).

A mixture of 6.24 g (18.9 mmol) of A-1, 3.94 g (37.9 mmol) of malonic acid, 0.24 g (2.8 mmol) of piperidine, and 10 mL of pyridine was heated in an oil bath at 100° C. for 1 hour. The mixture was heated to 130° C. for 1 hour, then cooled to room temperature. The mixture was treated with 100 mL of water and 10 mL of concentrated aqueous HCl. The mixture was extracted with 150 mL of diethyl ether. The separated ethereal layer was washed successively with 50 mL of 1.0 N aqueous HCl and 50 mL of brine. The separated ethereal layer was dried over $MgSO_4$, filtered, and concentrated in vacuo to give 7.0 g (99.6%) of compound A-2 as a pale yellow solid of sufficient purity to carry forward without further purification. $^1$H NMR ($CDCl_3$, 500 MHz): δ 11.80 (br product as a colorless oil. $^1$H NMR (CDCl$_3$, 500 MHz): δ 4.4-4.1 (m), 3.7-3.5 (m), 1.8-0.0 (m).

Example 14

Synthesis of D14

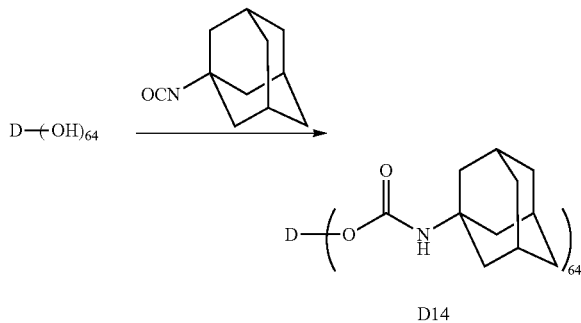

D14

To a solution of 1.0 g (0.137 mmol) of D-(OH)$_{64}$ and 5 mg of 4-dimethylaminopyridine in 5 mL of pyridine was added a solution of 2.3 g (13 mmol) of 1-adamantylisocyanate (Aldrich) in 5 mL of THF. The mixture was stirred at ambient temperature for 17 hours then treated with 1 mL of acetic anhydride. The mixture was stirred at ambient temperature for 30 minutes then treated with 10 mL of water. The supernatant was decanted and the remaining residue was dissolved in 5 mL of methylene chloride. The mixture was treated with 20 mL of methanol and the resulting precipitate was filtered off. The filter cake was washed with 2×5 mL of methanol and dried in vacuo at 100° C. to give a white powder. $^1$H NMR (CDCl$_3$, 500 MHz): δ 4.4-4.1 (m), 3.8-3.4 (m), 2.2-1.1 (m).

Example 15

Dielectric Film Fabrication

Dendritic macromolecule formulations were prepared by dissolving 1-150 mg of a selected dendritic macromolecule in 1 mL of solvent. The formulations were spin-coated onto clean silicon substrates at 1000-2000 rpm (acceleration 20) to give films of thicknesses in the range of about 50-650 nm. Highly n-doped silicon wafers (obtained from Montco Silicon Tech, Inc., Spring City, Pa.) were cleaned by sonication in organic solvents before use. After the spin-coating step, the films were then annealed in a vacuum oven at about 50-100° C. for about 1-10 minutes to completely remove any residual solvent.

Example 16

Dielectric Characterization

Metal-insulator-semiconductor (MIS) capacitor structures were fabricated using the resulting dielectric films, and the capacitance of the dielectric films was measured. For MIS structure fabrication, heavily doped n-type Si (MEMC Electronic Materials, Antimony/n-doped) was used as the metal onto which the dielectric film was spin-coated to form the insulating layer. Top Au electrodes (area=1500 μm×1500 μm) were then vacuum-deposited on top of the photodendritic macromolecule insulator at <1×10$^{-6}$ Torr to complete the MIS capacitor structure. Using a shadow mask, rectangular- or square-shaped Au pads having a feature size ranging from 100 μm×100 μm to 1000 μm×1000 μm, can be deposited to form MIS structures of different sizes. Unless otherwise specified, leakage currents in this and following examples were determined using capacitor structures with Au pads having a feature size of 100 μm×100 μm.

Figure 10:
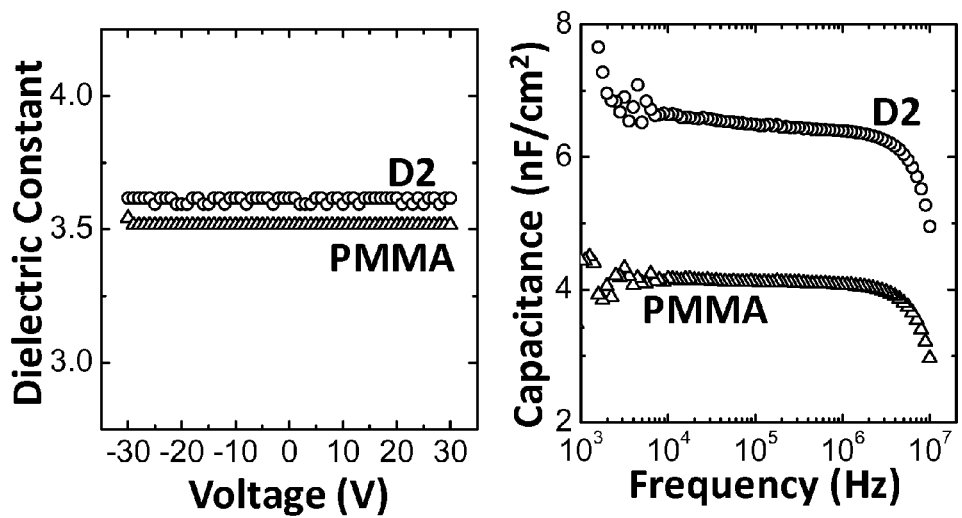
FIG. 10 illustrates representative dielectric constant (k) vs. voltage (V) and capacitance (C) vs. frequency (f) plots of a dendrimer-based capacitor according to the present teachings and a comparative capacitor incorporating a conventional dielectric material (PMMA).
Figure 11:
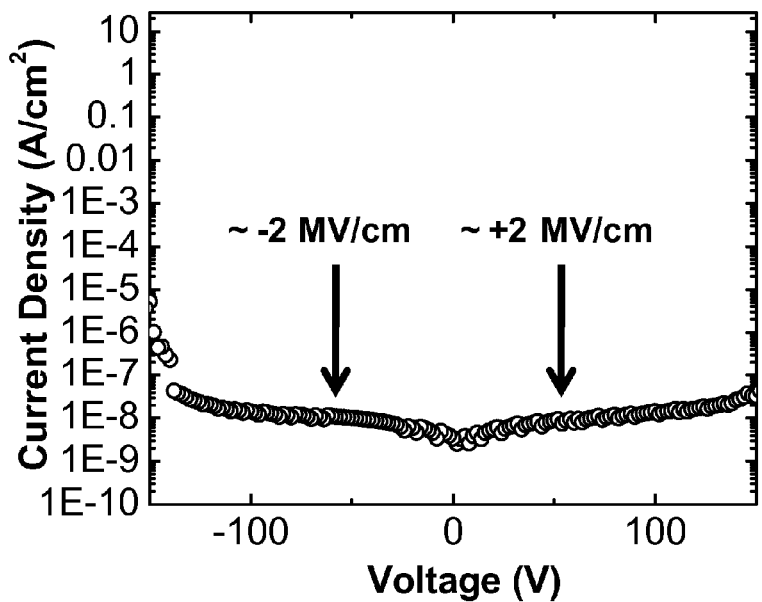
FIG. 11 provides a leakage current density (J) vs. voltage (V) plot of metal-insulator-metal capacitor structures that were fabricated using dielectric materials of the present teachings.

The current (I)-voltage (V) responses of the MIS structures were measured using a high sensitivity Keithley 4200 semiconductor characterization system. All of the measurements were performed in ambient atmosphere (relative humidity=30-80%). To minimize electrical noise during the I-V scan, a triaxial cabling and probing system (Signatone, Gilroy, Calif.) was employed to probe the MIS structures. The combined use of the Signatone triaxial probing system and the Keithley 4200 system reduced the noise level to as low as 10$^{-15}$ A and provided accurate current measurements as low as 10$^{-14}$ A. During the measurements, the bottom electrode was probed with an instrument ground and the top Au pads were probed with a soft tip from the Triaxial probe connected to the Keithley source meter. As controlled by the Keithley 4200 program, an I-V scan was performed by applying bias to the traixial probe and measuring current through the circuit. The scan rate was between 5-15 s/step, which was controlled by setting the delay time to between 0.5 s and 2 s and the number of measurements per step between 10 and 20. A representative plot of leakage current density (J) versus voltage (V) is shown in FIG. 11. A digital capacitance meter (Model 3000, GLK Instruments) and impedance/gain-phase analyzer (SI 1260, Solartron Analytical) were used for capacitance measurements. Representative plots of dielectric constant (k) versus voltage (V) and capacitance (C) vs. frequency (f) are shown in FIG. 10.

Example 17

Figure 12:
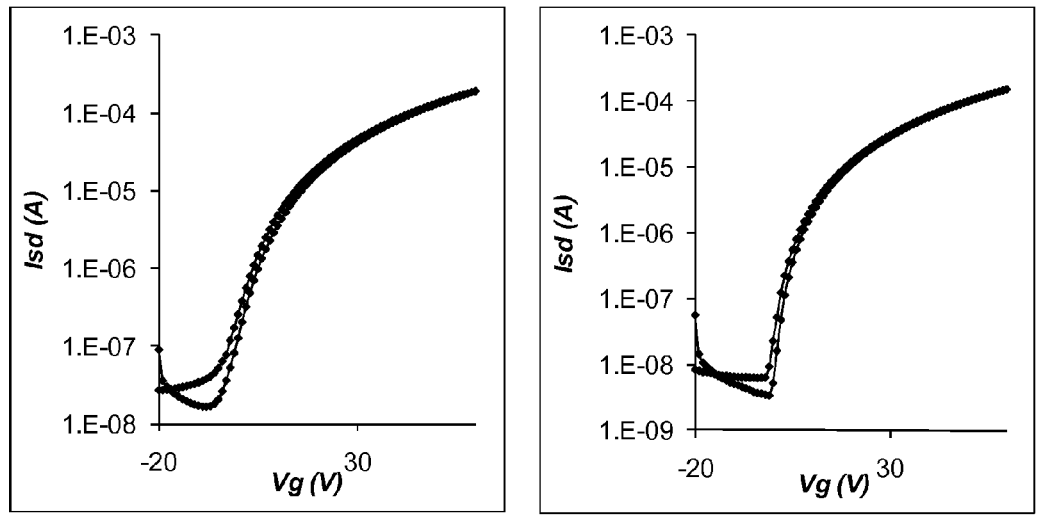
FIG. 12 provides representative output plots of top-gate dicyano-perylenecarboxydiimide-based organic field effect transistors fabricated with dielectric materials of the present teachings.

Top-Gate OFETs with a Dendritic Macromolecule Dielectric Layer and Solution-Processed N-Type Semiconductor In this example, bottom-contact top-gate OFETs were fabricated using a dielectric material of the present teachings as the dielectric layer. Step 1. Substrate: Glass slides 1"×1", 0.4 mm thickness (PGO) were cleaned by sonication in ethanol three times and kept in ethanol before the next step. Step 2. Source and drain electrodes: Glass substrates from Step 2 were loaded onto a CV302-FR metal evaporator (Cooke Vacuum). Gold electrodes were evaporated through a shadow mask with channel dimension 25×500, 50×1000 and 75×1500 μm to a final thickness of 300 Å at the evaporation rate of 0.6 Å/s. Step 3. Semiconductor spincoating: A corecyanated perylene semiconductor was prepared as a 7 mg/mL solution in DCB (Aldrich) and carefully heated on a 120° C. heating plate until the compound was completely dissolved. Substrates from step 2 were loaded onto the spin-coater and the semiconductor solution was applied to the substrate through a 0.2 μm PTFE syringe filter (Millipore) and was spin-coated at 1500 rpm (acceleration 20). The resulting film was baked at about 110° C. on a hot-plate before proceeding to the next step. Step 4. Gate Dielectric The dielectric layer was prepared by spin-coating a solution of dendrimer D1 or D2 at 1000 rpm (acceleration 20) for 2 minutes. The film was baked at about 110° C. in a vacuum oven for about 20 minutes. Step 5. Gate electrode: The gate electrode was evaporated in the same metal evaporator mentioned about to a final thickness of about 300 Å at a rate of 0.6 Å/s. The devices were tested using a Signatone H100 series probe station equipped with Keithley Interactive Test Environment software in a 4-terminal-n-FET mode. Transfer plots were recorded with 60 V drain bias, 0 V source bias, and a gate bias sweeping from −60 V to 60 V at 5 V intervals. Output plots were recorded with 0-60 V drain bias with 5 V steps and 0-60 V gate bias with 10 V steps, source bias at 0V. Transfer plots of such top-gate devices are shown in FIG. 12.

Example 18

Figure 13:
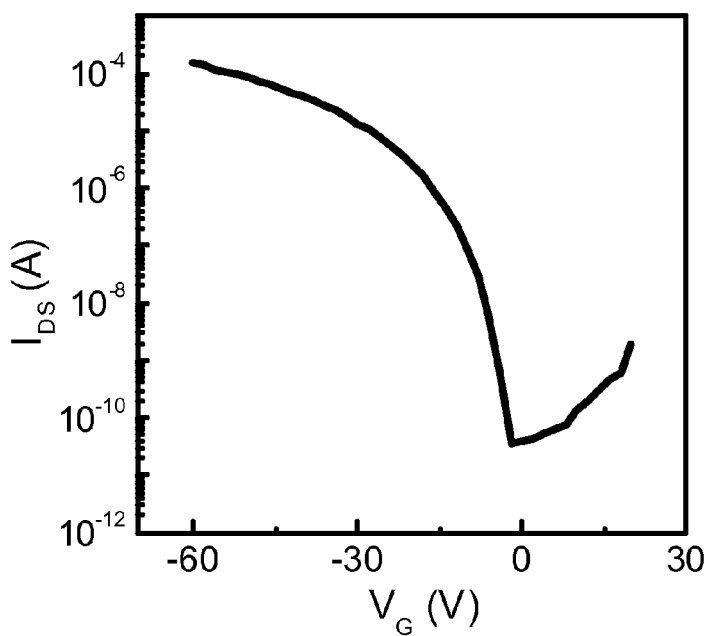
FIG. 13 provides a representative output plot of a bottom-gate pentacene-based organic field effect transistor fabricated with a dielectric material of the present teachings.

Bottom-Gate, Top-Contact OFETs with a Dendritic Macromolecule Dielectric Layer and Vapor-Deposited Pentacene Semiconductor Pentacene OFETs were fabricated with dielectric films on silicon gate materials. A Si wafer (Montco) was prepared as 1"×1" pieces and cleaned by sonication with THF and ethanol. The wafers were loaded on a spin-coater and rinsed with methanol twice at 5000 rpm. A solution of the macromolecule of the present teachings (e.g., D1, D2, a D1+PMMA blend) was applied through a 0.22 um syringe filter and spin-coated at 1800 rpm at acceleration 20. The films were baked at about 110° C. in a vacuum oven for about 20 minutes. Pentacene (Sigma-Aldrich, St. Louis, Mo.) was vacuum-deposited at about $2\times10^{-6}$ Torr (500 Å, 0.3 Å/s) while maintaining the substrate temperature at about 50° C. to about 70° C. Gold (Au) electrodes were vacuum-deposited through shadow masks at $3\text{-}4\times10^{-6}$ Torr (500 Å, 0.3 Å/s). The channel length was 50 μm, and the channel width was 5000 μm. Measurements were performed as in Example 16. Representative OFET transfer plots are shown in FIG. 13.

OFET performances of the dendritic macromolecule-based devices are summarized in Table 1.

TABLE 1

Performance of devices fabricated using dielectrics of the present teachings.

| Device Structure | Dielectric | Semiconductor | Carrier mobility $\mu_{sat}$ (cm$^2$/Vs) | $I_{on}/I_{off}$ |
|---|---|---|---|---|
| Top-gate, bottom-contact | D1 | PDI1MP-CN2 | 1-2 | $10^4$–$10^5$ |
| Top-gate, bottom-contact | D2 | PDI1MP-CN2 | 0.5-2 | $10^4$–$10^5$ |
| Top-gate, bottom-contact | D4 | PDI1MP-CN2 | 0.5-1 | $10^4$–$10^5$ |
| Top-gate, bottom-contact | D5 | PDI1MP-CN2 | 0.5-1 | $10^4$–$10^5$ |
| Bottom-gate, top-contact | D1 | Pentacene | 0.1-0.5 | $10^5$–$10^6$ |
| Bottom-gate, top-contact | D1 + PMMA | Pentacene | 0.1-0.5 | $10^5$–$10^6$ |

The present teachings encompass embodiments in other specific forms without departing from the spirit or essential characteristics thereof. The foregoing embodiments are therefore to be considered in all respects illustrative rather than limiting on the present teachings described herein. Scope of the present invention is thus indicated by the appended claims rather than by the foregoing description, and all changes that come within the meaning and range of equivalency of the claims are intended to be embraced therein.

What is claimed is:

1. An electronic device comprising:
   a dielectric material comprising a dendritic macromolecule, wherein the dendritic macromolecule comprises branched ends functionalized with an organic group comprising at least one optionally substituted 3-40 membered cyclic group, and wherein the dendritic macromolecule is derived from at least one non-aromatic repeating unit and is not a polysiloxane; and
   a semiconducting material or an electrically conductive material coupled to the dielectric material.

2. The device of claim 1, wherein the dendritic macromolecule has the formula:

D-(L-R$^1$)$_n$, wherein:
   D is the residue of a dendrimer or hyperbranched polymer comprising at least one non-aromatic repeating unit, wherein the dendrimer or hyperbranched polymer is not a polysiloxane;
   L is a covalent bond or a linker group;
   R$^1$ is an organic group comprising one, two, three or four optionally substituted 3-40 membered cyclic groups; and
   n is an integer in the range of 12-1024.

3. The device of claim 2, wherein the dendritic macromolecule is a reaction product of a compound of the formula X—R$^1$ with a dendrimer or hyperbranched polymer comprising branched ends having a first reactive group, wherein X is a second reactive group that reacts with the first reactive group to provide a covalent bond or a linker group selected from —O—, —C(O)—, —OC(O)—, —NR—, —NRC(O)—, —O—SiR$_2$—, -Ph-, -Ph-O—, -PhCH$_2$—, -PhCH$_2$—O—, -1,2,3-triazolo—, —RC=CR—, —C≡C—, —SO$_2$—, and —S(O)—, wherein R is H or a C$_{1-6}$ alkyl group, and Ph is a divalent phenyl group.

4. The device of claim 2, wherein D is a dendrimer or hyperbranched polymer of third generation or higher, and has a molecular weight or molecular weight average between about 1,000 Da and about 1,000,000 Da.

5. The device of claim 2, wherein the hyperbranched polymer is selected from a hyperbranched polyester, a hyperbranched polyamide, a hyperbranched polyether, a hyperbranched polyamine, a hyperbranched polyurethane, a hyperbranched polyolefin, a hyperbranched polyimide, a hyperbranched poly(amido-amine), a hyperbranched poly(amide-ester), a hyperbranched poly(amine-ester), and a hyperbranched poly(ether-ester), and the dendrimer is selected from a polyester dendrimer, a polyamide dendrimer, a polyether dendrimer, a polyamine dendrimer, a polyurethane dendrimer, a polyolefin dendrimer, a polyimide dendrimer, a poly(amido-amine) dendrimer, a poly(amide-ester) dendrimer, a poly(amine-ester) dendrimer, and a poly(ether-ester) dendrimer.

6. The device of claim 2, wherein the hyperbranched polymer is a hyperbranched aliphatic polyester, a hyperbranched aliphatic-aromatic polyester, a hyperbranched aliphatic poly(ether-ester), or a hyperbranched aliphatic-aromatic poly(ether-ester).

7. The device of claim 2, wherein the hyperbranched polymer is a hydroxyl end-functionalized hyperbranched aliphatic polyester comprising a polyalcohol core.

8. The device of claim 1, wherein the optionally substituted 3-40 membered cyclic groups are C$_{3\text{-}40}$ cycloalkyl groups independently selected from cyclopropane, cyclobutane, cyclopentane, cyclohexane, cycloheptane, cyclooctane, bicyclobutane, bicyclopentane, bicyclohexane, bicycloheptane, bicyclooctane, bicyclononane, bicyclodecane, bicycloundecane, sterane, adamantane, cubane, and prismane, each of which optionally is substituted with 1-5 substituents independently selected from a halogen, CN, OH, a $C_{1-10}$ alkyl group, a $C_{2-10}$ alkenyl group, a $C_{2-10}$ alkynyl group, a $C_{1-10}$ haloalkyl group, a $C_{1-10}$ alkoxyl group, and a $C_{1-10}$ alkylthio group.

9. The device of claim 1, wherein the optionally substituted 3-40 membered cyclic groups independently are selected from cyclopentene, cyclohexene, cyclohexadiene, cycloheptatriene, norbornene, and a completely or partially hydrogenated analog of naphthalene, anthracene, phenanthrene, cyclopentaphenanthrene, pyrene, benzopyrene, chrysene, naphthacene, pentacene, pentalene, fluoranthene, benzofluoranthene, fluorene, benzofluorene, perylene, picene, coronene, corannulene, triphenylene, or ovalene, each of which optionally is substituted with 1-5 substituents independently selected from a halogen, CN, OH, a $C_{1-10}$ alkyl group, a $C_{2-10}$ alkenyl group, a $C_{2-10}$ alkynyl group, a $C_{1-10}$ haloalkyl group, a $C_{1-10}$ alkoxyl group, and a $C_{1-10}$ alkylthio group.

10. The device of claim 1, wherein the organic group is selected from:

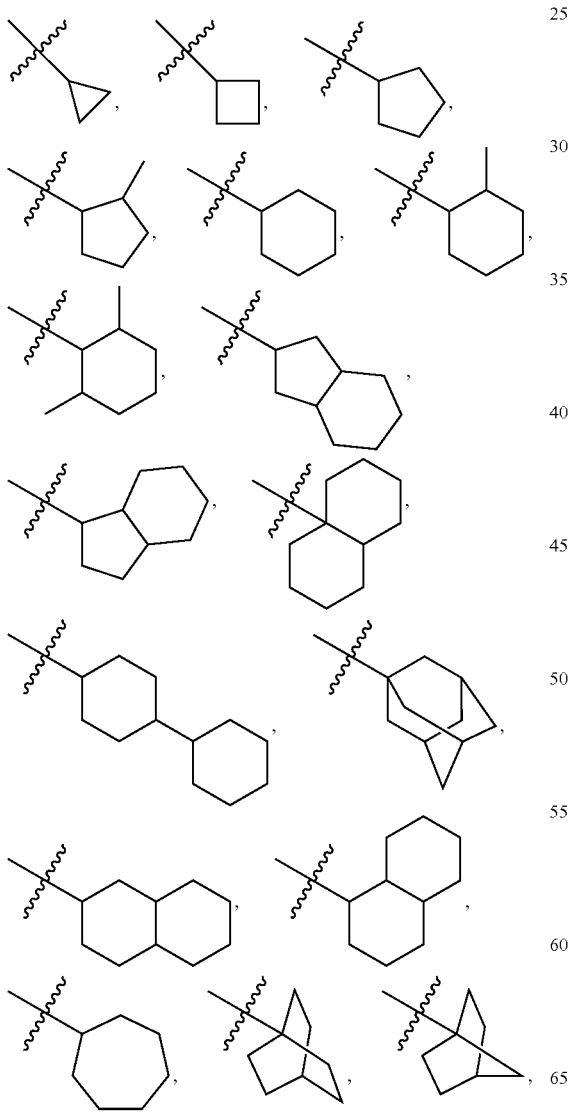

-continued

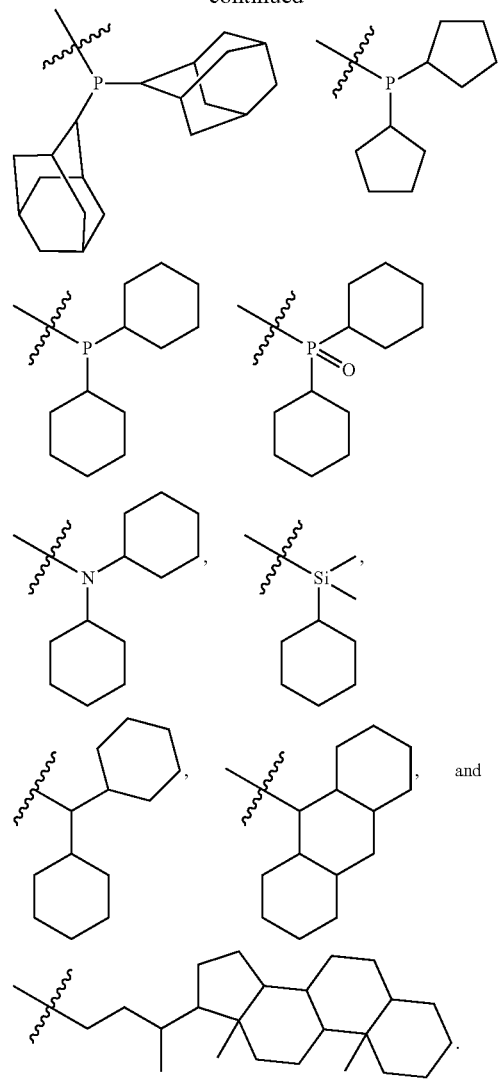

11. The device of claim 1, wherein the organic group comprises one or more photocrosslinkable groups capable of undergoing cycloaddition upon photo-stimulation, the one or more photocrosslinkable groups being selected from an optionally substituted 3-40 membered cyclic group comprising one or more unsaturated carbon-carbon bonds, a photocrosslinkable linker, and a 3-40 membered cyclic group substituted with a photocrosslinkable substituent.

12. The device of claim 11, wherein the organic group is selected from:

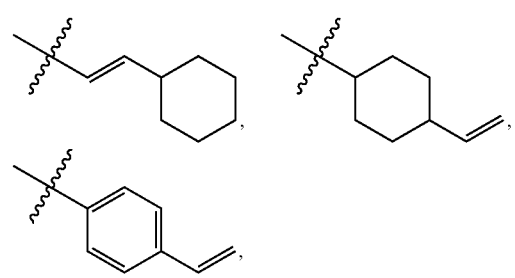

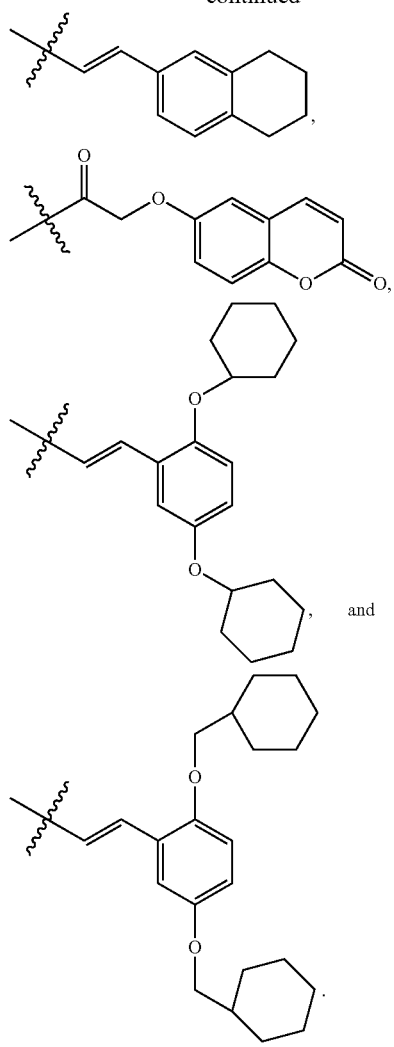

13. The device of claim 1, wherein the organic group comprises a thermally crosslinkable group selected from:

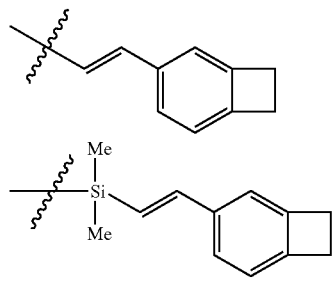

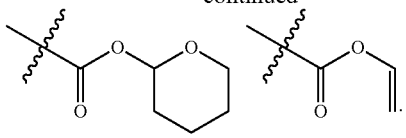

14. The device of claim 1, wherein the dielectric material is in the form of a multi-layer laminate, and wherein at least one layer of the multi-layer laminate comprises the dendritic macromolecule.

15. The device of claim 1, wherein the device is a thin-film capacitor comprising the dielectric material in the form of a thin film coupled to a first electrically conductive material as a top electrode on one side and a second electrically conductive material as a bottom electrode on an opposite side, or a thin-film transistor comprising the dielectric material in the form of a thin film coupled to an electrically conductive material as a gate electrode on one side and a semiconducting material as a semiconductor layer on an opposite side, the thin-film transistor further comprises source and drain electrodes coupled to the semiconductor layer.

16. An electronic device comprising:
  a dielectric material comprising a photocrosslinked product of a dendritic macromolecule, wherein the dendritic macromolecule comprises branched ends functionalized with an organic group capable of undergoing cycloaddition upon photo-stimulation and comprising at least one optionally substituted 3-40 membered cyclic group, and wherein the dendritic macromolecule is derived from at least one non-aromatic repeating unit and is not a polysiloxane; and
  a semiconducting material or an electrically conductive material in contact with the dielectric material.

17. The device of claim 16, wherein the organic group comprises a cinnamoyl group or a coumarinyl group.

18. An electronic device comprising:
  a dielectric material comprising a dendritic macromolecule, wherein the dendritic macromolecule is derived from at least one non-aromatic repeating unit and is selected from a polyester dendrimer, a polyamide dendrimer, a polyether dendrimer, a polyamine dendrimer, a polyurethane dendrimer, a polyolefin dendrimer, a polyimide dendrimer, a poly(amido-amine) dendrimer, a poly(amide-ester) dendrimer, a poly(amine-ester) dendrimer, a poly(ether-ester) dendrimer, a hyperbranched polyester, a hyperbranched polyamide, a hyperbranched polyether, a hyperbranched polyamine, a hyperbranched polyurethane, a hyperbranched polyolefin, a hyperbranched polyimide, a hyperbranched poly(amido-amine), a hyperbranched poly(amide-ester), a hyperbranched poly(amine-ester), and a hyperbranched poly(ether-ester), and wherein the dendritic macromolecule comprises branched ends functionalized with an organic group comprising at least one optionally substituted $C_{3-40}$ cycloalkyl groups; and
  a semiconducting material or an electrically conductive material in contact with the dielectric material.

* * * * *